United States Patent [19]

Kariya et al.

[11] Patent Number: 5,456,762
[45] Date of Patent: Oct. 10, 1995

[54] PHOTOELECTRIC CONVERSION ELEMENTS

[75] Inventors: Toshimitsu Kariya, Nara; Keishi Saito, Soraku, both of Japan

[73] Assignee: Canon Kabushiki Kaisha, Tokyo, Japan

[21] Appl. No.: 171,430

[22] Filed: Dec. 22, 1993

[30] Foreign Application Priority Data

Dec. 28, 1992 [JP] Japan ................................. 4-349586

[51] Int. Cl.$^6$ .................... H01L 31/075; H01L 31/0368; H01L 31/0376
[52] U.S. Cl. ........................ 136/258; 257/55; 257/64; 257/65; 257/458; 136/249
[58] Field of Search ................... 136/258 AM, 258 PC, 136/249 TJ; 257/458, 55, 64, 65

[56] References Cited

U.S. PATENT DOCUMENTS 4,766,008  8/1988  Kodato ................................. 427/578

FOREIGN PATENT DOCUMENTS 60-210826  10/1985  Japan ............................ 136/258 PC

OTHER PUBLICATIONS

T. Watanabe et al., *Jap. J. Appl. Phys.*, vol. 26, Apr. 1987, pp. L288–L290.
C. Wang et al., *Conference Record 21st IEEE Photovoltaic Specialists Conf.*, May 1990, pp. 1614–1618.
Hattori, Y., et al., "High Efficiency Amorphous Heterojunction Solar Cell Employing ECR–CVD Produced p–type Microcrystalline SiC Film", Technical Digest of the International PVSEC-3, Tokyo, Japan (1987), pp. 171–174.
Hattori, Y., et al., "High-Conductive Wide Band Gap P–Type a–SiC:H Prepared by ECR CVD and Its Application to High Efficiency a–Si Basis Solar Cells," 19th IEEE Photovoltaic Specialists Conference—(1987), pp. 689–694.
Kodato, S., et al., "A High–accuracy Quick–response Optical Power Sensor with uc–Ge: H Thin Film," Sens. Actuators A 28 (1), pp. 63–68.
Naito, E., et al., "Thermoelectric Characteristics & Microcrystalline Ge Thin Film and its Application to Sensors," Inst. of Electrical Engineers of Japan, Senior Technology Research Meeting Materials, pp. 19–28.
Azuma, K., et al., "A–Si Solar Cell by Microwave Plasma CVD," Proc. 50th Scientific Lecture Meeting in the Japan Society of Appl. Physics, p. 566.

*Primary Examiner*—Aaron Weisstuch
*Attorney, Agent, or Firm*—Fitzpatrick, Cella, Harper & Scinto

[57] ABSTRACT

The present invention provides photoelectric conversion elements, wherein the long wavelength sensitivity, the fill factor, and the photoelectric conversion efficiency are improved. In order to provide photoelectric conversion elements wherein light deterioration is reduced, the field durability enhanced, and the temperature characteristic improved, a p-layer composed of amorphous silicon type semiconductor containing hydrogen, an i-layer composed of amorphous silicon-germanium type semiconductor containing hydrogen and further including microcrystalline germanium, and an n-layer composed of amorphous silicon type semiconductor containing hydrogen are laminated on a substrate, the i-layer being formed at a substrate temperature from 400° to 600° C. by microwave plasma CVD, the particle diameter of said microcrystalline germanium ranging from 50 to 500 angstroms. Also, the content of microcrystalline germanium varies in the layer thickness direction.

19 Claims, 10 Drawing Sheets

FIG. 5  DEPOSITION APPARATUS 200

PHOTOELECTRIC CONVERSION ELEMENTS

BACKGROUND OF THE INVENTION

1. Field of the Invention

The present invention relates to photoelectric conversion elements with the photovoltaic effect which are suitably applicable to solar cells and photosensors. Solar cells are used as components for solar light power generation systems, electronic calculators, and night indicator lamps, for example. Also, photosensors are employed as components of facsimile apparatuses, image scanners, and factory automation (FA) equipment.

In particular, the present invention relates to photovoltaic elements of the pin-type composed of non-single crystalline silicon type semiconductor material. Also, this invention relates to photovoltaic elements having an amorphous silicon-germanium semiconductor layer in the photovoltaic layer. Also, this invention relates to photovoltaic elements containing microcrystalline germanium. Also, this invention relates to photovoltaic elements wherein the doping layer (p-layer and n-layer) and the i-layer are formed by microwave plasma CVD (MWPCVD).

2. Related Background Art

In recent years, much research has been conducted for the purpose of using amorphous silicon-germanium in photoelectric conversion elements, e.g., photovoltaic elements. For example, a photovoltaic element for efficiently converting long wavelength light into electric power by using an amorphous a-SiGe layer for photovoltaic power generation, or a photosensor using an a-SiGe layer for the photovoltaic layer are applications making effective use of the feature that the light sensitivity thereof is very close to the sensitivity of the human eye. Also, it is superior for detecting long wavelength light. However, it has been found that the a-SiGe photovoltaic layer of the photovoltaic element of the present invention is different from conventional a-SiGe in terms of Raman scattering, electron beam diffraction, and high resolution electron microscopic observation.

Conventionally, microcrystalline germanium (mc-Ge) has been used for temperature sensors, optical power sensors, and infrared sensors. Examples are shown in "A high-accuracy quick-response optical power sensor with μc-Ge:H thin film", S. Kodato, Y. Naito, K. Kuroda, S. Kodama, *Sens. Actuators A*, vol. 28, No. 1, pp. 63–68, and "Thermoelectric characteristics of microcrystalline germanium thin film and its application to sensors", Etsunobu Naito, Yasuji Uchida, Kazuo Mizuno, Setsuo Yoshidatsuchi, Institute of Electrical Engineers of Japan, Sensor Technology Research Meeting on Materials.

However, a photovoltaic element with mc-Ge contained in the photovoltaic layer has not been reported. Also, there have been few researches concerning such application, resulting in too low a quality for application to photovoltaic elements.

On the other hand, regarding the film forming apparatus, several studies for making photovoltaic elements have been conducted using the MWPCVD method, which has a higher deposition rate and is superior in source gas utilization efficiency. For example, the following article discloses forming the i-layer by a MWPCVD method: "a-Si solar cell by microwave plasma CVD", Kazufumi Higashi, Takeshi Watanabe, Toshikazu Shimada, Proceedings of The 50th Scientific Lecture Meeting in The Japanese Society of Applied Physics, p. 566. In this photovoltaic element, a good quality i-layer is obtained at higher deposition rate by MWPCVD.

Also, examples of articles disclosing forming the doping layer by MWPCVD include:

"High Efficiency Amorphous Solar Cell Employing ECR-CVD Produced p-type Microcrystalline SiC Film", Y. Hattori, D. Kruangam, T. Toyama, H. Okamoto and Y. Hamakawa, Proceedings of the International PVSEC-3, Tokyo, Japan (1987) p. 171, and "HIGH-CONDUCTIVE WIDE BAND GAP P-TYPE a-SiC:H PREPARED BY ECR CVD AND ITS APPLICATION TO HIGH EFFICIENCY a-Si BASIS SOLAR CELLS", Y. Hattori D. Kruangam, K. Katou Y. Nitta, H. Okamoto and Y. Hamakawa, Proceedings of 19th IEEE Photovoltaic Specialists Conference (1987) p. 689.

In these photovoltaic elements, a good-quality p-layer is obtained by using the MWPCVD method for forming the p-layer. However, in these examples, mc-Ge is not referred to.

The above-mentioned a-SiGe solar cell had a problem that the open-circuit voltage is too low and the fill factor (FF) is small, although the a-SiGe layer can be used in the photovoltaic layer to efficiently convert light ranging from short wave to long wave into electric power. Further, if the a-SiGe layer is used in the photovoltaic layer, light deterioration (reduced electrical characteristics after subjecting the photoelectric conversion element to light illumination for a long time) is problematical. Also, photosensors using the a-SiGe layer as the photoelectric conversion layer had a problem with the residual image characteristic.

SUMMARY OF THE INVENTION

The present invention aims to solve the aforesaid conventional problems as well as providing photoelectric conversion elements suitable for use as solar cells, wherein the open circuit voltage and the fill factor are enhanced, and the light deterioration is suppressed. Also, this invention aims to provide photoelectric conversion elements suitable for use as photosensors, wherein the residual image characteristic is improved. Further, this invention aims to provide photoelectric conversion elements wherein the temperature characteristic is improved.

The present invention has been achieved as a result of careful examination to solve the conventional problems and accomplish the above objects, and provides photovoltaic elements characterized by a semiconductor region having p-type conductivity composed of a non-single crystalline silicon type semiconductor containing hydrogen (hereinafter referred to as a p-layer), a semiconductor region having substantially i-type conductivity composed of a non-single crystalline silicon-germanium type semiconductor containing hydrogen (hereinafter referred to as an i-layer), and a semiconductor region having n-type conductivity composed of a non-single crystalline silicon type semiconductor containing hydrogen (hereinafter referred to as an n-layer) being laminated on a substrate, the i-layer being formed at a substrate temperature from 400° to 600° C., using microwave plasma CVD, and the i-layer contains microcrystalline germanium, the particle diameter of the microcrystalline germanium ranging from 50 to 500 angstroms.

Also, the present invention provides photovoltaic elements wherein a p-layer composed of an amorphous silicon type semiconductor containing hydrogen, an i-layer composed of an amorphous silicon-germanium type semiconductor containing hydrogen, and an n-layer composed of an amorphous silicon type semiconductor containing hydrogen are laminated on a substrate, the i-layer being formed by microwave plasma CVD, characterized in that the i-layer is formed by a process wherein a separate plasma region (A) is formed where a plasma is excited by directing microwave radiation to a gas containing germanium, and a separate plasma region (B) is formed where a plasma is excited by directing microwave radiation to a gas containing silicon and germanium, radicals "Rg" containing germanium produced in the region (A) and radicals "R" containing silicon and/or germanium produced in the region (B) are reacted in a region (C) different from the region (A), and the i-layer contains microcrystalline germanium, the particle diameter of the microcrystalline germanium ranging from 50 to 500 angstroms.

Also, a preferred embodiment of the present invention is a photovoltaic element characterized in that the content of microcrystalline germanium varies in the direction of layer thickness.

Also, the present invention comprises a photoelectric conversion element characterized in that the region (C) is a p-layer or n-layer surface.

Further, the present invention comprises a photoelectric conversion element, characterized in that the p-layer and/or n-layer are (is) formed at a substrate temperature of 400° to 600° C., using microwave plasma CVD, and contains microcrystalline germanium, the particle diameter of the microcrystalline germanium ranging from 50 to 500 angstroms.

Still further, the present invention comprises a photoelectric conversion element, characterized in that the p-layer and/or n-layer is formed by a process wherein a separate plasma region (AA) is formed where a plasma is excited by directing microwave radiation to a gas containing germanium, and a plasma region (BB) is formed where a plasma is excited by directing microwave radiation to a mixture of a gas containing silicon and a gas containing germanium, radicals "Rge" containing germanium produced in the region (AA) and radicals "Rr" containing silicon and/or germanium produced in the region (BB) are reacted in a region (CC) different from the region (AA), and the i-layer contains microcrystalline germanium, the particle diameter of the microcrystalline germanium ranging from 50 to 500 angstroms.

Also, the present invention comprises a photoelectric conversion element, characterized in that the region (CC) is a substrate or an i-layer surface.

Further, the present invention comprises a photoelectric conversion element, characterized in that the i-layer contains microcrystalline silicon, the particle diameter of the microcrystalline silicon ranging from 50 to 500 angstroms.

Also, the present invention comprises a photoelectric conversion element, characterized in that the p-layer and/or n-layer contains microcrystalline silicon, the particle diameter of the microcrystalline silicon ranging from 50 to 500 angstroms.

Also, the present invention comprises a photoelectric conversion element, characterized in that the position at which the content of microcrystalline germanium is at maximum resides between the central position of the i-layer and the p-layer.

Further, a preferred embodiment of the present invention comprises a photovoltaic element, characterized in that the content of microcrystalline silicon in the i-layer varies in the layer thickness direction, and the position at which the content is at a minimum resides between the central position of the i-layer and the p-layer.

With the above constitution, the photovoltaic element of the invention has a higher sensitivity in the long wavelength region and a higher fill factor, as well as an enhanced photoelectric conversion efficiency.

Also, the photovoltaic element has reduced light deterioration with a higher field durability and a superior temperature characteristic. Also, the photosensor has suppressed residual image and oscillation deterioration.

The present invention can offer a higher productivity of photovoltaic elements because of the formation by microwave plasma CVD.

DETAILED DESCRIPTION OF THE PREFERRED EMBODIMENTS

Figure 1:
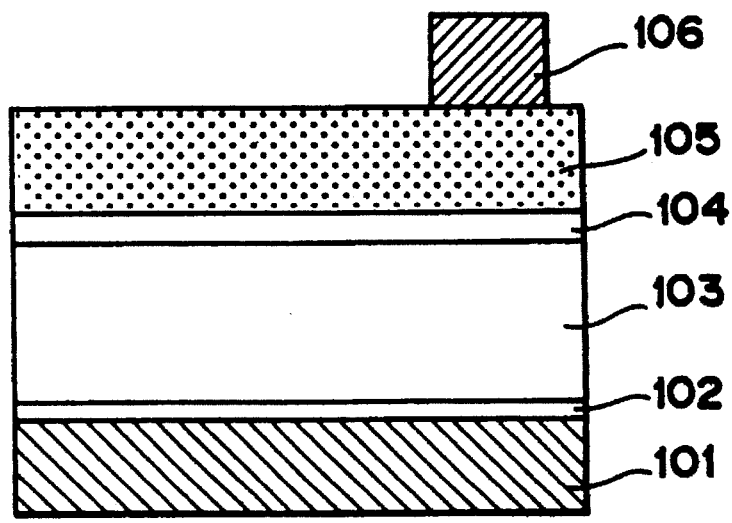
FIG. 1 is a typical layer constitutional view of a photoelectric conversion element according to the present invention.

The present invention will be described in detail with reference to the drawings. FIG. 1 is a typical schematic view of a photovoltaic element which is a photoelectric conversion element of the present invention, this photovoltaic element being of the pin-type. In FIG. 1, the photovoltaic element of the present invention is comprised of a substrate 101, an n-layer (or p-layer) 102, an i-layer 103, a p-layer (or n-layer) 104, a transparent electrode 105, and a collector electrode 106 (in this case, light is incident from the side of the transparent electrode.)

Figure 2:
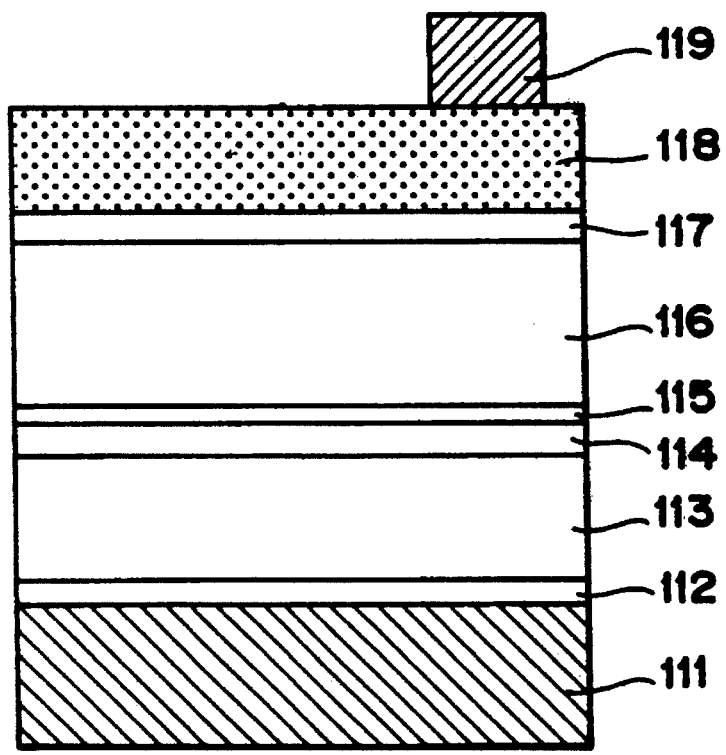
FIG. 2 is a typical layer constitutional view of another photoelectric conversion element according to the present invention.

FIG. 2 is a typical schematic view of another photovoltaic element of the present invention, wherein a double tandem cell of the pin-type is represented. In FIG. 2, this photovoltaic element is comprised of a substrate 111, an n1-layer (p1-layer) 112, an i1-layer 113, a p1-layer (n1-layer) 114, an n2-layer (p2-layer) 115, and i2-layer 116, a p2-layer (n2-layer) 117, a transparent electrode 118, and a collector electrode 119 (in this case, light is incident from the side of transparent electrode but may be incident from the side of the substrate if the substrate is transparent).

Figure 3:
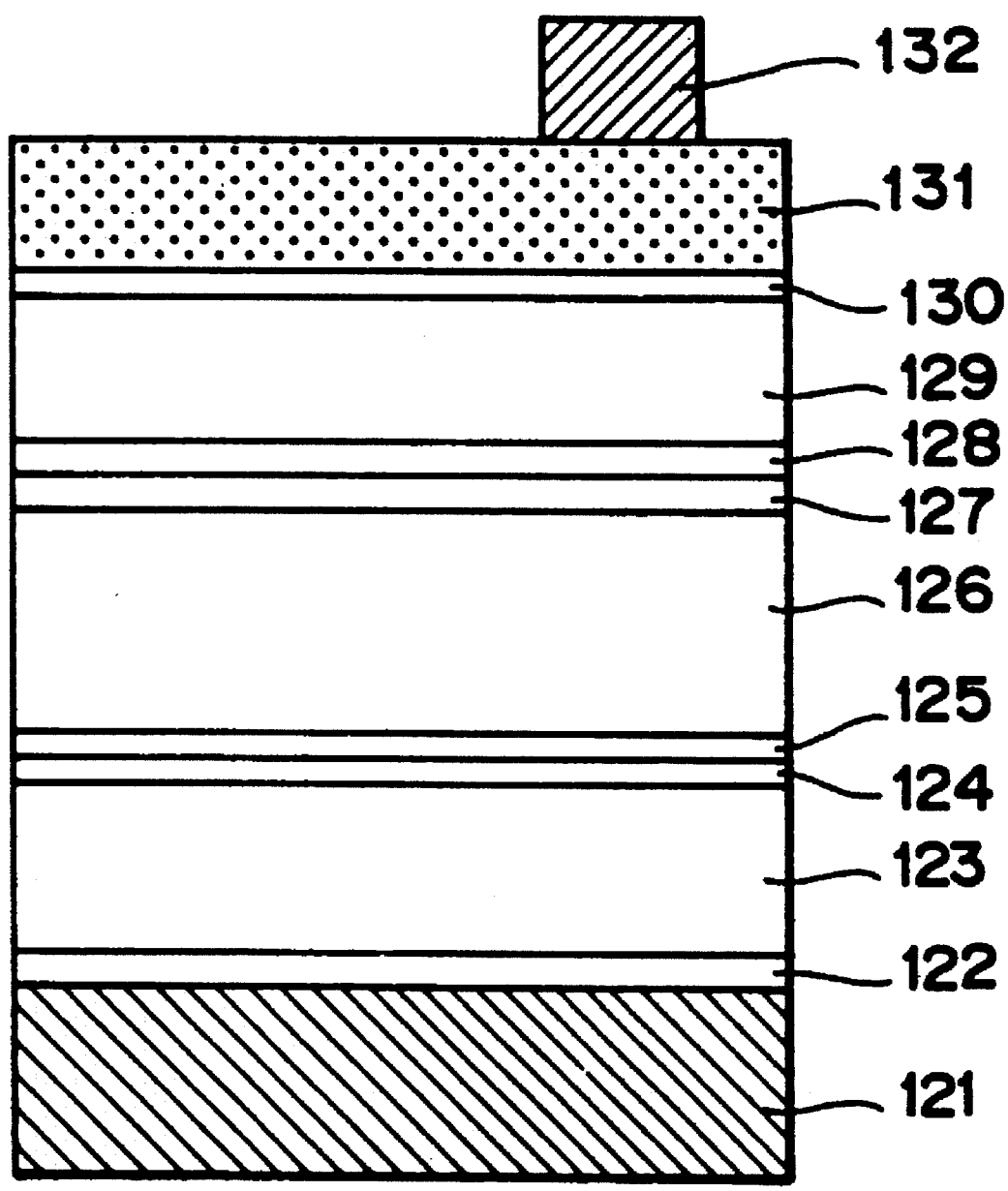
FIG. 3 is a typical layer constitutional view of a further photoelectric conversion element according to the present invention.

FIG. 3 is a typical schematic view of a further photoelectric conversion element of the present invention, wherein a triple tandem cell of the pin-type is represented. In FIG. 3, this photovoltaic element is comprised of a substrate 121, an n1-layer (p1-layer) 122, an i1-layer 123, a p1-layer (n1-layer) 124, an n2-layer (p2-layer) 125, an i2-layer 126, a p2-layer (n2-layer) 127, an n3-layer (p3-layer) 128, an i3-layer 129, a p3-layer (n3-layer) 130, a transparent electrode 131, and a collector electrode 132.

Figure 4:
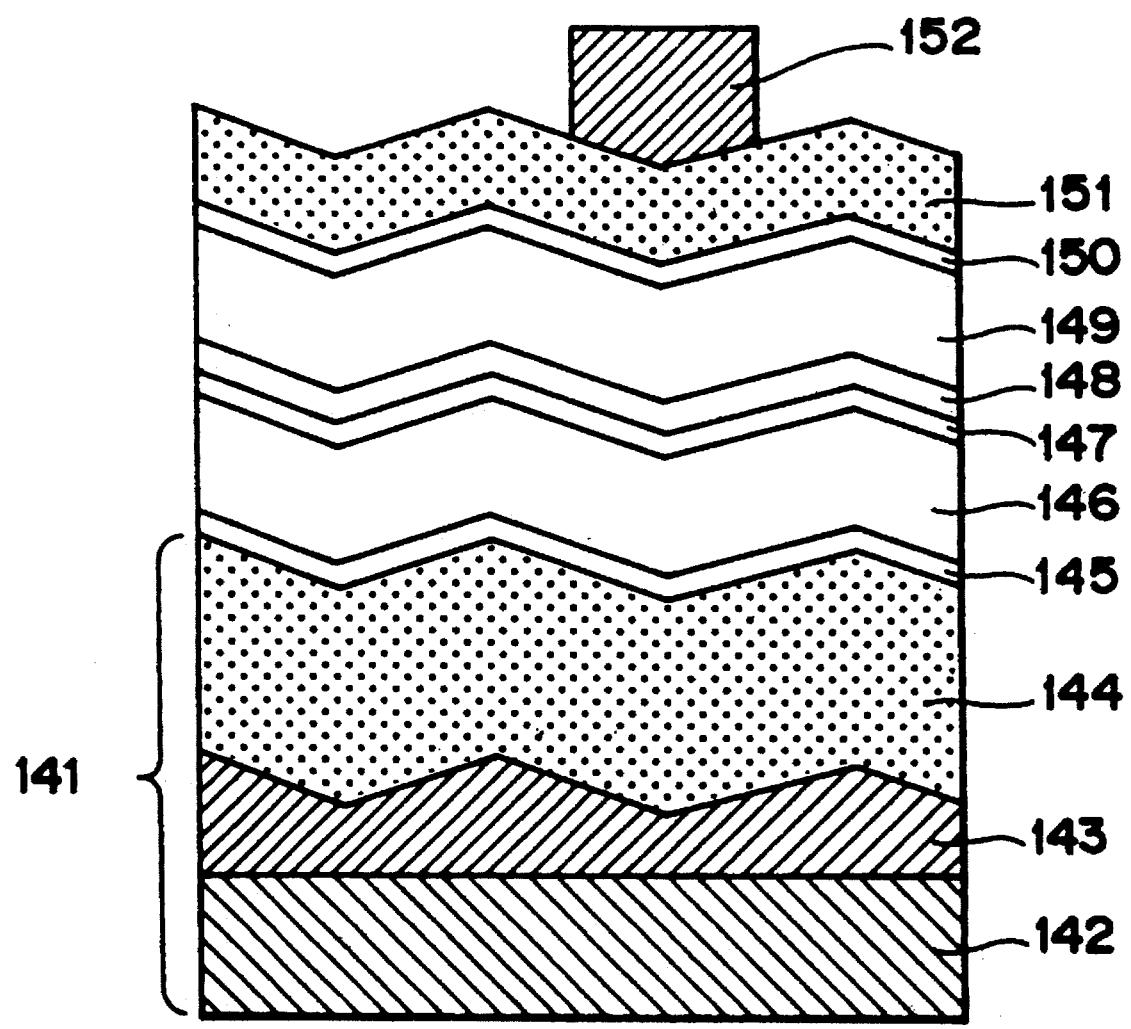
FIG. 4 is a typical layer constitutional view of a photovoltaic element according to the present invention.

FIG. 4 is a typical schematic view of another photoelectric conversion element of the present invention, wherein a double tandem cell of the pinpin-type is represented, this photoelectric conversion element having a light reflection layer 143 with an irregular surface and a transparent conductive layer 144 under the pinpin-type layer. In FIG. 4, this photovoltaic element is comprised of a support 142, a light reflection layer 143, a transparent conductive layer 144 (142, 143, and 144 are collectively referred to as a substrate 141), an n1-layer (p1-layer) 145, an i1-layer 146, a p1-layer (n1-layer) 147, an n2-layer (p2-layer) 148, an i2-layer 149, a p2-layer (n2-layer) 150, a transparent electrode 151, and a collector electrode 152.

Further, in addition to the photovoltaic elements being of the pin-type structure as shown in FIGS. 1–4, the photovoltaic elements may have an nip-type structure where the n-layer and p-layer are laminated in reverse order.

Still further, in FIGS. 1 to 4, the i-layer may be constituted of a plurality of different layers. For example, the i-layer may comprise a lamination of a layer formed by RF plasma CVD (RF-i layer) and an i-layer (MW-i layer) formed by microwave plasma CVD, and a lamination of an i-layer composed of SiGe and an i-layer composed of Si, SiGe, SiC, and SiN, each of which are non-single crystal layers. Further, a transition layer may be provided between the p-layer and the i-layer, and between the n-layer and the i-layer. By providing the transition layer, each layer can be continuously formed. One such transition layer may be an RF-i layer.

The photovoltaic layer (i-layer) of the present invention is considered to be divided into a region for absorbing long wavelength light, and a region for absorbing short wavelength light and transporting photocarriers produced therein, wherein the former region contains microcrystalline germanium and the latter region is composed of amorphous silicon-germanium. These regions are joined by a semiconductor junction, the interface of which is considered to be excellent and with a quite low interfacial level.

The photovoltaic element of the present invention can absorb long wavelength (800 nm to 1500 nm) light, because of microcrystalline germanium contained in the i-layer composed of amorphous silicon-germanium semiconductor, wherein the generated photocarriers are separated into electrons and holes due to an electric field within the i-layer which is the primary photovoltaic layer, electrons being efficiently transported to the p-layer due to this internal electric field. Therefore, the photovoltaic element of the present invention has a large short circuit photocurrent (Jsc), the percentage (photoelectric conversion efficiency) of generated electric power relative to the incident light energy (electric power) being 9% or greater. Such high photoelectric conversion efficiency ($\eta$) is an important characteristic factor for the photovoltaic elements such as solar cells.

Figure 9A:
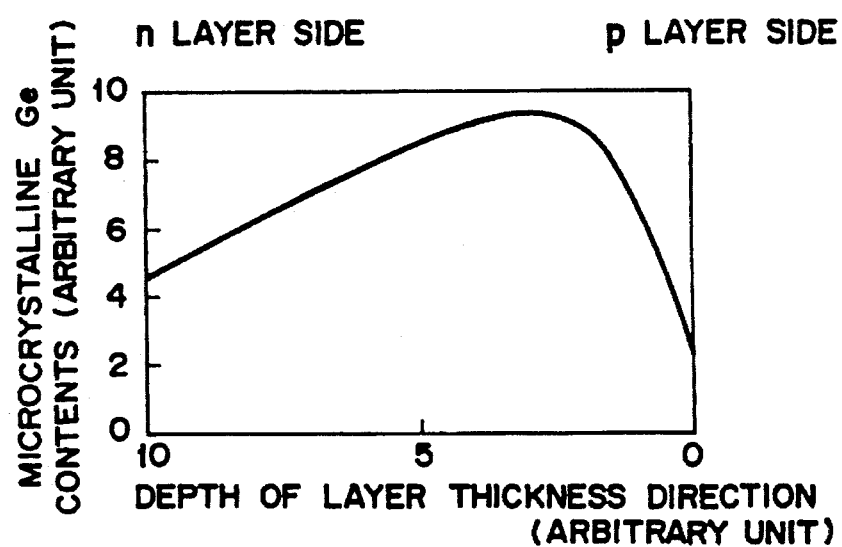
FIGS. 9A, 9B, and 9C are characteristic diagrams showing the varying content of microcrystalline germanium in the layer thickness direction in the present invention.
Figure 10A:
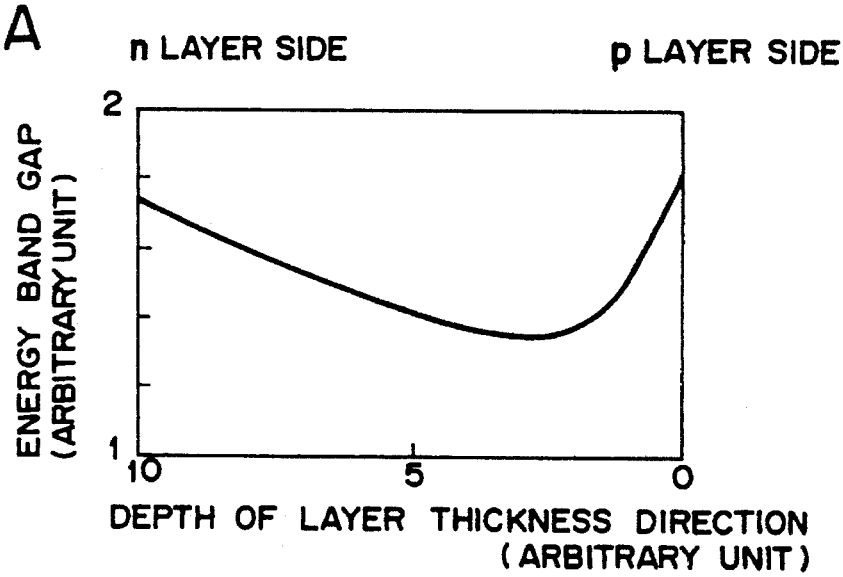
FIGS. 10A, 10B, and 10C are characteristic diagrams showing the varying bandgap in the layer thickness direction in the present invention.

The photovoltaic element of the present invention has the content of microcrystalline germanium in the i-layer smoothly changing in the layer thickness direction. By doing so, the photoelectric conversion efficiency can be improved. If the content of microcrystalline germanium is smaller on the p-layer side and the n-layer side of the i-layer, and the position at which the content of microcrystalline germanium is at a maximum occurs at the p-layer side within the bulk, as shown in FIG. 9A, the bandgap of the i-layer becomes a maximum on the p-layer side and the n-layer side, and the minimum value resides on the p-layer side within the bulk, as shown in FIG. 10A. Therefore, the separation of electrons and holes is efficiently effected on the p-layer side of the i-layer because of a large electric field in the conduction band, resulting in reduced recombination of electrons and holes in the neighborhood of the p-layer and the i-layer. Also, electrons can be prevented from diffusing back into the p-layer. Further, with the electric field of the valence electron band increasing from the i-layer toward the n-layer, the recombination of electrons and holes excited on the n-layer side of the i-layer can be reduced.

In particular, the present invention is especially effective when there is a hetero junction (Si/SiN, Si/SiC) between the i-layer and the doping layer. Typically, it is believed that most interfacial levels and internal stresses occur at the hetero junction interface. The photovoltaic element of the present invention contains at least microcrystalline germanium in the vicinity of the hetero junction interface, so that the interfacial levels can be reduced, and the internal stresses can be relieved. Accordingly, the photovoltaic element is less susceptible to deterioration of the electrical characteristics even under an oscillating environment.

Typically, it is known that a greater content of microcrystalline germanium in the i-layer composed of non-single crystalline silicon type semiconductor material results in a smaller bandgap. In the following, desirable patterns of the content of microcrystalline germanium in the i-layer of the photovoltaic element of the present invention will be presented in connection with the drawings.

FIG. 9A is a graph in which the content of microcrystalline geranium in the i-layer is drastically changed on the p-layer side, with the minimum value of the content taking place on the p-layer side within the bulk, as previously described. In this case, the bandgap is shown in FIG. 10A, wherein if light is incident from the p-layer side, the high electric field in the vicinity of the interface between the p-layer and the i-layer and the high electric field in the vicinity of the interface between the n-layer and i-layer can be more effectively used, resulting in greater collection efficiency of photoexcited electrons and holes in the i-layer. Also, if light is incident from the n-layer side in the photovoltaic element of the nip-type, the variation pattern may be reversed with respect to the layer thickness direction. Also, when the bandgap of the i-layer is small (e.g., amorphous silicon), there is especially a great effect. When the p/i interface is a hetero junction, there is a further effect.

Figure 9B:
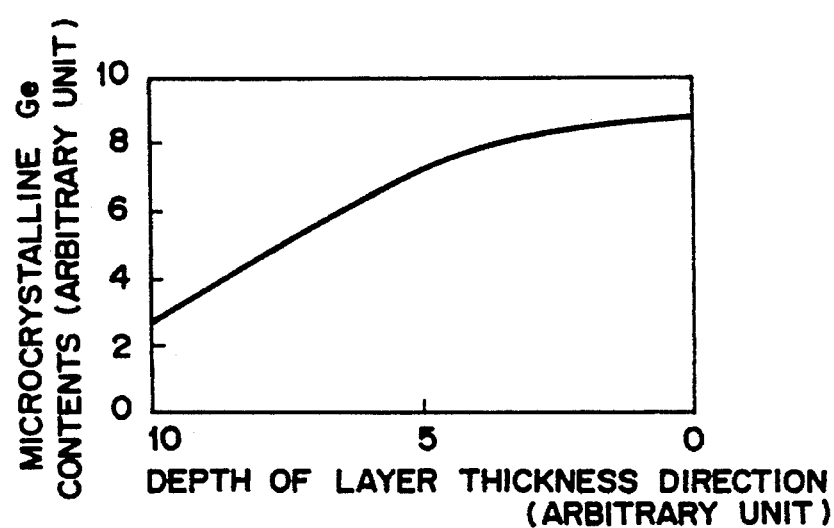
Figure 10B:
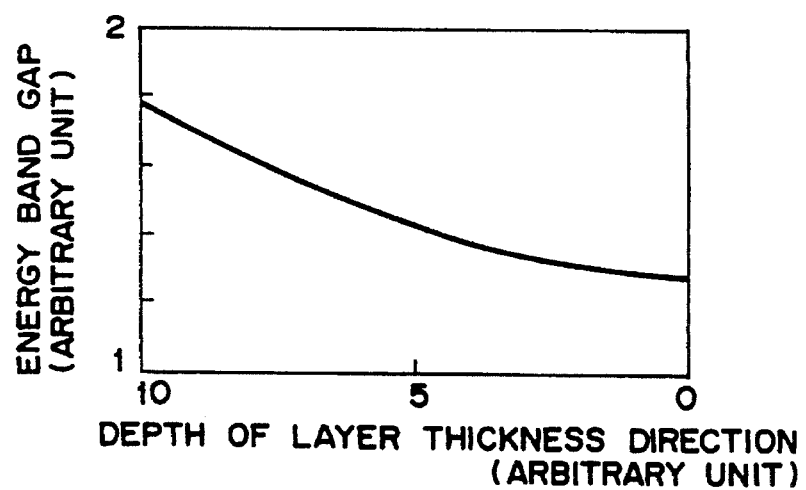

FIG. 9B shows an instance where the content of microcrystalline germanium is gradually changed from the p-layer side toward the n-layer side, the minimum value of the content being at the interface with the n-layer. In this case, the bandgap is shown in FIG. 10B, whereby the electric field of the valence electron band can be increased over the entire thickness of the i-layer, and especially, the carrier range for holes can in particular be enhanced, with the fill factor improved. Also, in the photovoltaic element of the nip-type, if light is incident from the n-layer side, the variation pattern may be reversed with respect to the layer thickness direction. Also, when the bandgap of the i-layer is small (e.g., amorphous silicon), there is an especially great effect.

Figure 9C:
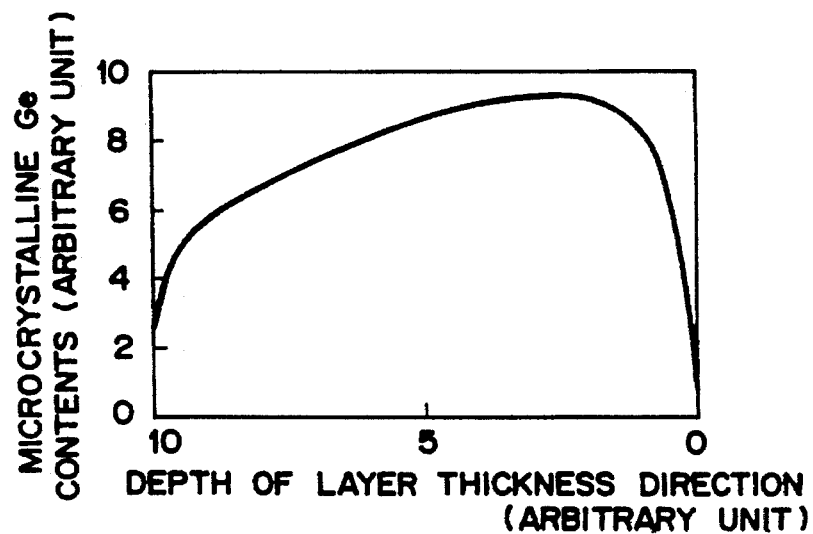
Figure 10C:
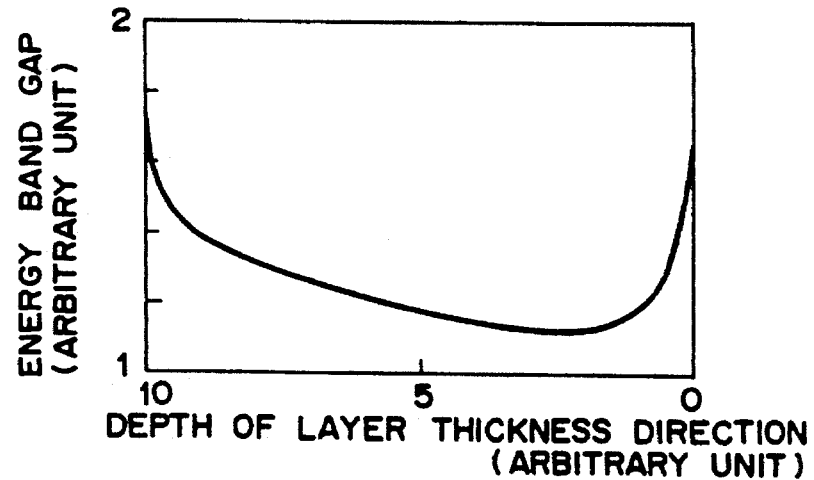

FIG. 9C shows an instance where the content of microcrystalline germanium is drastically changed on the p-layer side and the n-layer side of the i-layer. In this case, the bandgap is shown in FIG. 10C, wherein the electric field of conduction band can be enhanced on the p-layer side of the i-layer, and especially the reverse diffusion of electrons back to the p-layer can be suppressed. Also, the electric field of the valence electron band can be strengthened on the n-layer side of the i-layer, and especially the reverse diffusion of holes back to the n-layer can be suppressed. Also, the content of microcrystalline germanium as shown in FIG. 9C and the variation pattern of the bandgap as shown in FIG. 10C are especially effective for photovoltaic elements having an i-layer with large bandgap (e.g., amorphous silicon carbide). That is, when light is incident from the p-layer side in FIG. 10C, the i-layer with large bandgap cannot absorb sufficient light such that photoexcited carriers in the vicinity of the interface between i-layer and n-layer are separated without recombination due to a strong electric field in the vicinity of this interface, resulting in higher collection efficiency. Further, there is the beneficial effect on the photovoltaic elements of having a light reflection layer. That is, if light is incident from both sides of the photovoltaic element having the light reflection layer, the collection efficiency can be likewise raised. As described above, the carrier range can be enhanced and the fill factor can be improved. When the p/i interface and the n/i interface are of hetero junction type, there is especially an effect.

Also, while photoelectric conversion elements for absorbing light having a long wavelength (800 nm to 1000 nm) using a-SiGe in the photoelectric conversion layer had a problem that the fill factor (FF) was small, the photoelectric conversion element of the present invention has a large FF because of microcrystalline germanium contained in the i-layer composed of a-SiGe as the base material, resulting in a higher photoelectric conversion efficiency. Also, in photosensors, it is necessary to apply an electric field to the photoelectric conversion layer from the outside, and instantly inject the generated photocarriers into the electrodes (for better optical response), for which the improvement in the fill factor is important. Also, if there is a deep level in the photoelectric conversion layer or doping layer in the photosensor, generated photocarriers are trapped, and may be again excited as carriers. While photosensors have thermally excited carriers which appear as the residual image, photosensors using photoelectric conversion elements of the present invention have no deep level, resulting in the residual image phenomenon being prevented.

Also, the photoelectric conversion element of the present invention has improved temperature characteristics. That is, thermally excited carriers are reduced, resulting in reduced temperature influence as compared with conventional ones.

Accordingly, the range of service environment temperature is extended, and the rise time of an apparatus employing photoelectric conversion elements can be shortened.

Also, the photovoltaic element of the present invention has microcrystalline germanium contained in the doped layer (n-layer and/or p-layer), and thus is superior to conventional doped layers. That is, when a-SiGe was used as the doped layer(s) in the solar cell, there was a problem that the carrier density was low and the open-circuit voltage was small, but the photovoltaic element of the present invention has microcrystalline geranium as above noted contained in the base material composed of non-single crystalline silicon semiconductor of the doped layer(s), thus resulting in higher carrier density, and therefore providing an increased open circuit voltage of the photovoltaic element and improved photoelectric conversion efficiency. As noted previously, the occurrence of thermally excited carriers can be suppressed, so that the residual images can be prevented from occurring in photosensors.

Microcrystalline silicon (mc-Si) contained in the semiconductor material also can suppress the occurrence of light deterioration. Also, the region of microcrystalline silicon, the region of microcrystalline germanium, and other regions adjoin one another via semiconductor junctions(s), whereby the interfacial level is low. When microcrystalline silicon is contained in the doped layer, the carrier density can be further enhanced so that the open circuit voltage of the photovoltaic element can be increased. Further, since the transmittance of visible light can be increased, it is effective for the doped layer of photovoltaic element.

Figure 11A:
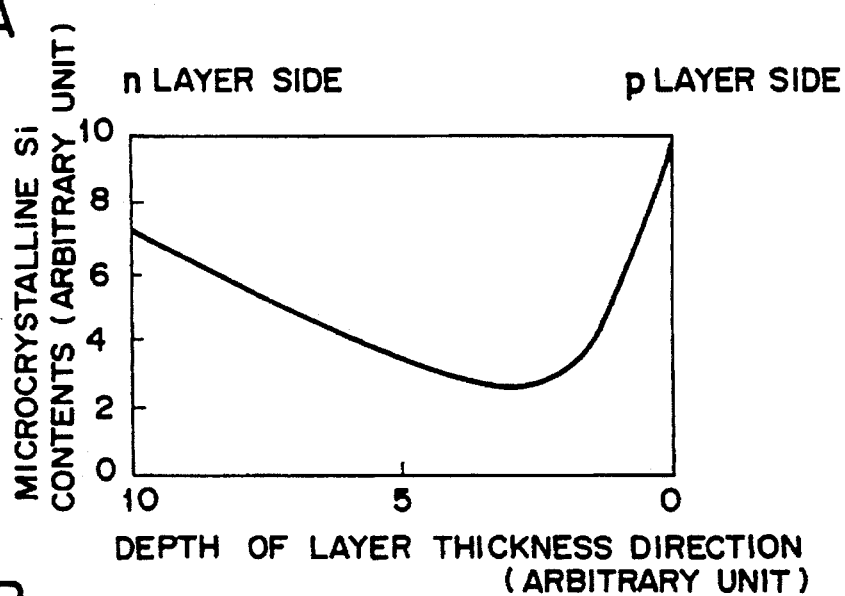
FIGS. 11A, 11B, and 11C are characteristic diagrams showing the varying content of microcrystalline silicon in the layer thickness direction in the present invention.
Figure 11B:
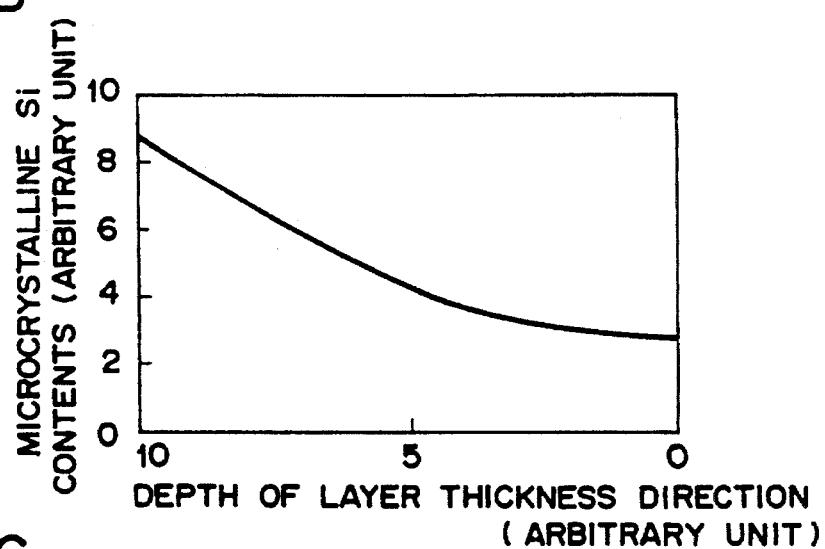
Figure 11C:
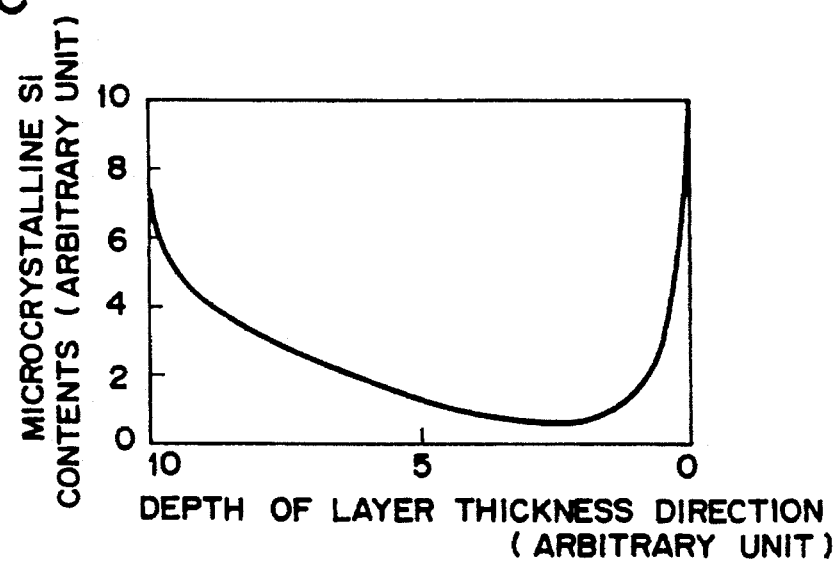

Also, since in the present invention, the content of microcrystalline silicon in the i-layer varies in the layer thickness direction, the position of the minimum content being between the central position of the i-layer and the p-layer, the photoelectric conversion efficiency can be enhanced. That is, in the regions having greater content of microcrystalline germanium, by reducing the content of microcrystalline silicon, the defect level can be decreased. Also, if the content is increased in the vicinity of the interface with the doping layer, the open circuit voltage can be enhanced. Accordingly, for the variation in the content of microcrystalline germanium as shown in FIG. 9A, the variation in the content of microcrystalline silicon as shown in FIG. 11A is desirable. Similarly, for the variation in the content of microcrystalline germanium as shown in FIG. 9B, the variation in the content of microcrystalline silicon as shown in FIG. 11B is desirable. And for the variation in the content of microcrystalline germanium as shown in FIG. 9C, the variation in the content of microcrystalline silicon as shown in FIG. 11C is desirable. When the doping layer is composed of microcrystalline silicon, the internal stress is relieved, resulting is less decrease in the characteristics under an oscillating environment.

Conventionally, several methods for fabricating crystalline germanium have been known, including a float zone (FD) method, a Czochralski method, and a ribbon pulling method. The methods for forming thin film crystalline germanium on a substrate include an RF plasma CVD method (RFPCVD method), a photo CVD method, a thermal CVD method, and a sputtering method, which methods involve forming thin films at substrate temperatures of 700° to 900° C., or annealing at substrate temperatures of 600° to 800° C. thin films formed at substrate temperatures of 100° to 300° C., or thermally annealing thin films formed at substrate temperatures of 100° to 300° C. by means of a laser. With these methods, the substrate temperature is raised, and substrates made of cheap material, for example, stainless steel, cannot be used. Also, with these methods, the temperature becomes too high to contain microcrystalline germanium in the amorphous silicon germanium type semiconductor layer, resulting in poor quality amorphous silicon-germanium type semiconductor. However, with the method for forming semiconductor layers of the photoelectric conversion element of the present invention, good quality amorphous silicon germanium type semiconductors containing microcrystalline germanium can be formed at relatively low temperatures. That is, the MWPCVD method has the following features:

(1) Formation is made at substrate temperatures of 400° to 600° C.

(2) A region (A) where a plasma is excited by directing microwave radiation to a gas containing germanium (e.g., GeH$_4$) and a region (B) where a plasma is excited by directing microwave radiation to a gas containing silicon (e.g., SiH$_4$) and a gas containing germanium (e.g., GeH$_4$) are separately provided, and radicals "Rg" containing germanium produced in the region (A) and radicals "R" containing silicon or germanium produced in the region (B) are reacted in a different region (in the vapor phase) from the region (A).

(3) Radicals "Rg" and radicals "R" are reacted on the substrate surface (semiconductor surface).

With the methods (1) to (3), the crystallization of germanium occurs at lower temperatures than conventional substrate temperatures, resulting in a wider range of usable substrate materials. With the methods (2) and (3), the radicals "Rg" containing germanium in the region (A) are clusters of germanium already having crystallinity, whereby it is considered that the MWPCVD can easily produce germanium clusters having crystallinity in the vapor phase. With the methods (2) and (3), it is preferable that vapor phase reaction of radicals be activated with a pressure in the plasma region (A) from 50 to 500 mTorr, and with a shorter mean free path. Also, with the method (2), it is preferable that the vapor phase reaction of germanium clusters as above and radicals "R" containing silicon be activated with the pressure in the plasma region (B) being from 50 to 300 mTorr. Also, with the method (3), it is desirable that the reaction between germanium clusters as above mentioned and radicals "R" in the vapor phase be suppressed to a minimum with the pressure being from 0.1 to 10 mTorr. With the methods (2) and (3), the suitable substrate temperature ranges from 200° to 400° C.

When microcrystalline silicon, together with microcrystalline germanium, is contained, the following methods in addition to the methods of (1) to (3) can be adopted.

(I) The substrate temperature is raised above 450° C.

(II) Source gases containing fluorine (e.g., SiF$_4$, Si$_2$F$_6$, GeF$_4$, BF$_3$, etc.) are employed, and with the substrate temperature being from 300° to 600° C., a high MW electric power is introduced.

It has been confirmed, from Raman scattering, electron beam diffraction, and high resolution microscope observations, that deposited films formed by such methods contain microcrystalline germanium. In the Raman shift of Raman scattering, there were seen a broad peak near the wavelength of 480 cm$^{-1}$ corresponding to amorphous silicon and a sharp peak near the wavelength of 300 cm$^{-1}$ corresponding to microcrystalline germanium. Further, in the electron beam diffraction, a sharp ring was observed in a broad ring. Also, in the high resolution electron microscope observations, microcrystalline regions corresponding to microcrystalline germanium were observed. Also, in the samples in accordance with the forming conditions (I) and (II), a Raman shift with a sharp peak having a wavelength of 520 cm$^{-1}$ corresponding to microcrystalline silicon was seen.

In the present invention, the desirable crystal particle diameter of microcrystalline germanium is from 50 to 500 angstroms, wherein the influence of crystal grain boundaries arises below 50 angstroms, while above 500 angstroms, the properties similar to crystalline germanium result, such as an increase in dark current, so as not to be preferred for the pin layer of the photovoltaic element.

In the present invention, the microcrystalline germanium may contain hydrogen (or heavy hydrogen) and/or fluorine, the content being from 0.01 to 10%, and preferably from 0.01 to 5%.

In the present invention, the microcrystalline silicon may contain hydrogen (or heavy hydrogen) and/or fluorine, the content being from 0.01 to 10%, and preferably from 0.01 to 5%.

With the above-described methods, in order to change the content of microcrystalline germanium in the layer thickness direction, it is preferable with the method (1) that the substrate temperature be changed over time or the flow rate of source gas containing germanium be changed over time, or with the methods (2) and (3), the flow rate of source gas containing germanium introduced in the region (A) be changed over time. In order to contain more microcrystalline germanium, the substrate temperature may be raised with the method (1), or a greater amount of source gas containing germanium may be flowed with the methods of (1), (2), and (3). When a semiconductor layer is formed by a roll-to-roll method, in order to change the content of microcrystalline germanium in the layer thickness direction, it is preferable that the substrate temperature be changed in the direction of movement of the substrate, with the method (1), or radicals "Rg" containing germanium entering the surface of the substrate be changed spatially with the methods of (2) and (3).

With the above methods, in order to change the content of microcrystalline silicon in the layer thickness direction, it is preferable with the method (1) that the substrate temperature be changed over time, or with the methods of (2) and (3), that the flow rate of source gas (e.g., SiF$_4$) containing fluorine be changed over time. When a semiconductor layer is formed by the roll-to-roll method, in order to change the content of microcrystalline germanium in the layer thickness direction, it is preferable that the substrate temperature be changed over time, with the method (I), or radicals "Rf" produced from the source gas containing fluorine be changed spatially with the method (II).

Figure 5:
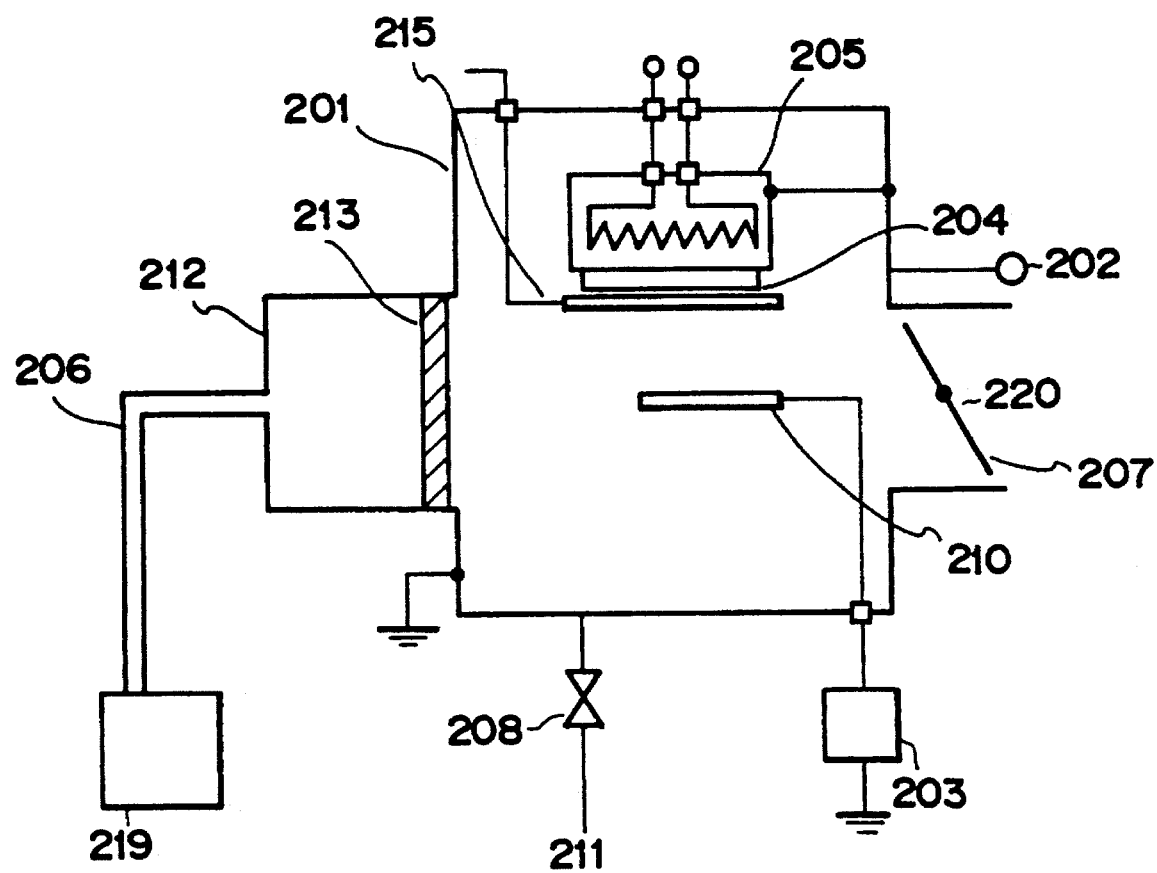
FIG. 5 is a deposition apparatus for use in manufacturing photoelectric conversion elements of the present invention.

FIG. 5 is a schematic view of a typical deposition apparatus suitable for forming the semiconductor layer of the photovoltaic element according to the present invention. The deposition apparatus 200 is comprised of a deposition chamber 201, a vacuum meter 202, a bias power source 203, a substrate 204, a heater 205, a waveguide 206, a conductance valve 207, a valve 208, a bias electrode 210, a gas introducing tube 211, an applicator 212, a dielectric window 213, a substrate shutter 215, a microwave power source 219, an exhaust opening 220, a vacuum evacuation pump (not shown) connected to the exhaust opening, and a source gas supply unit connected to the gas introducing tube. The source gas supply unit (not shown) is comprised of a source gas cylinder, a valve, and a mass flow controller. The dielectric window 213 is composed of a material which is transmissive to microwaves and can isolate the atmosphere from the vacuum, such as alumina ceramics (Al$_2$O$_3$), quartz, and boron nitride.

The fabrication of the photovoltaic element of the present invention is performed in the following way. The substrate is placed in contact with the heater 205 installed within the deposition apparatus of FIG. 5, and the deposition chamber is exhausted below 1×10$^{-5}$ Torr. For this exhausting, a turbo molecular pump or oil diffusion pump is suitable. After sufficiently exhausting the deposition chamber, a gas such as H$_2$, He, or Ar is introduced into the deposition chamber so that the deposition chamber pressure may be substantially equal to that when the source gas for the formation of semiconductor layer is flowed. The heater 205 is switched on to heat the substrate. If the temperature of the substrate becomes stable at a predetermined temperature, a predetermined amount of source gas for the formation of semiconductor layer is introduced via the mass controller from the gas cylinder, the supply amount of source gas for the formation of semiconductor layer being appropriately determined depending on the volume of the deposition chamber and the desired deposition rate.

When the semiconductor layer is formed by MWPCVD, the pressure during the formation of semiconductor layer is a very important factor, wherein the optimal pressure within the deposition chamber is preferably from 0.5 to 100 mTorr. Also, the MW electric power to be introduced in the deposition chamber is an important factor. The MW electric power is appropriately determined depending on the flow of source gas introduced into the deposition chamber, the preferable range being from 100 to 2000 W. The preferable frequency range of MW electric power is from 0.5 to 10 GHz, and particularly frequencies near 2.45 GHz are suitable. The MW electric power produced from the microwave power source 219 is transmitted through the waveguide 206, and introduced from the applicator 212 via the dielectric window 213 to the deposition chamber to excite a plasma, thereby forming a semiconductor layer having a desired layer thickness on the substrate. Thereafter, the introduction of MW electric power is stopped, the plasma is extinguished, the deposition chamber is evacuated and purged sufficiently with a gas such as $H_2$, He, or Ar, and the substrate is taken out from the deposition chamber.

In forming an i-layer of the photovoltaic element of the present invention, RF electric power may be applied to the bias electrode 210, together with the MW electric power. In this case, the MW electric power to be introduced is desirably smaller than the MW electric power necessary to decompose 100% of the source gas introduced into the deposition chamber, and further the RF electric power introduced at the same time is preferably in a range from 100 to 2000 W. A preferable frequency range of RF electric power is from 1 to 100 MHz. In particular, a frequency of 13.56 MHz is optimal. In particular, when the area of the RF electrode for the supply of RF electric power is smaller than the grounded area, it is preferable to ground the self-bias (DC component) on the voltage side of the supply of RF electric power. Also DC voltage may be applied to the bias electrode. A preferable range of DC voltage is approximately from 30 to 300 V. Also, both RF electric power and DC electric power may be applied simultaneously to the bias electrode.

When the p-layer and n-layer are formed by RFPCVD, RFPCVD of capacity coupling type is suitable. The RF electric power is applied to the bias electrode in FIG. 5. When the i-layer and the doping layer are formed by RFPCVD, the optimal conditions are such that substrate temperature within the deposition chamber is from 100° to 500° C., the pressure is from 0.1 to 10 Torr, the RF electric power is from 1 to 800 W, and the deposition rate is from 0.1 to 2 nm/sec.

U.S. Pat. No. 4,400,409 discloses a plasma CVD apparatus for forming semiconductor layers in a continuous manner in accordance with a roll-to-roll method. The photovoltaic element of the present invention is preferably continuously manufactured using such an apparatus. In this apparatus, a plurality of deposition chambers are provided, a lengthy, flexible substrate is disposed along the passage through the deposition chambers in succession, and semiconductor layers of the desired conductivity type are formed within the deposition chambers while the substrate is continuously conveyed along the longitudinal direction, whereby photovoltaic elements having a pin junction can be fabricated continuously. In this apparatus, gas gates are used to prevent source gases containing valence electron control agents to be contained in the semiconductor layers from diffusing into other deposition chambers and mixing into the other semiconductor layers. That is, the deposition chambers are separated from one another by means of slit-like separation passages, into each of which a scavenging gas such as Ar, $H_2$, or He is introduced to prevent mutual diffusion of source gases.

Photovoltaic elements of the present invention can be subjected to mass production by using the methods for forming semiconductor layers continuously, resulting in significantly lower manufacturing costs. With the methods for forming semiconductor layers by the MWPCVD or RFPCVD, source gases containing atoms to be included in the deposited films are suitably compounds gasifiable by the gases or by bubbling.

Table 1 lists suitable source gases.

TABLE 1

| Atoms to be contained in the deposited films | Source gases |
|---|---|
| Si | $SiH_4$, $SiD_4$, $Si_2H_6$, $SiF_4$, $Si_2F_6$ |
| Ge | $GeH_4$, $GeD_4$, $GeF_4$, $Ge_2H_6$, $Ge_3H_8$ |
| C | $CH_4$, $CD_4$, $C_2H_2$, $CF_4$ |
| O | $O_2$, NO, $CO_2$, CO |
| N | $N_2$, $NH_3$, NO, $NO_2$ |
| H(D) | $SiH_4$, $SiD_4$, $Si_2H_6$, $SiF_4$, $Si_2F_6$ $GeH_4$, $GeD_4$, $GeF_4$, $Ge_2H_6$, $Ge_3H_8$ $CH_4$, $CD_4$, $C_2H_2$, $CF_4$ |
| F | $SiF_4$, $Si_2F_6$, $GeF_4$, $CF_4$, $F_2$ |

Valence electron control agents to be contained in the deposited films to convert the conductivity type of the semiconductor layer into p-type include Group III atoms (B, Al, Ga, In, Tl) of the periodic table, and valence electron control agents to be contained to convert the conductivity type into n-type include Group V atoms (P, As, Sb, Bi) and Group VI atoms (S, Se, Te) of the periodic table.

Table 2 lists suitable source gases.

TABLE 2

| Valence electron control agents to be contained in the deposited films | Source gases |
|---|---|
| Group III atoms | $B_2H_6$, $B(CH_3)_3$ $B(C_2H_5)_3$, $BF_3$ $Al(CH_3)_3$, $Al(C_2H_5)_3$ |
| Group V atoms | $PH_3$, $AsH_3$, $PF_5$ |
| Group VI atoms | $H_2S$, $H_2Se$ |

The above source gases may be diluted appropriately with a gas such as $H_2$, $D_2$, He, or Ar prior to introduction into the deposition chamber.

Substrate

The substrate may be made of a single substance conductive material, or formed with a conductive layer on a support composed of an insulating material or conductive material. The conductive materials may include, for example, metals such as NiCr, stainless steel, Al, Cr, Mo, Au, Nb, Ta, V, Ti, Pt, Pb, Sn, and alloys thereof. To employ these materials for the support, a configuration of a sheet, a roll with a long sheet wound around a cylinder, or a cylinder is desirable.

The insulating materials include synthetic resins such as polyester, polyethylene, polycarbonate, cellulose acetate, polypropylene, polyvinyl chloride, polyvinylidene chloride, polystyrene, and polyamide, glass, ceramics, and papers. To employ these materials for the support, the configuration of a sheet, a roll with a long sheet wound around a cylinder, or a cylinder is desirable. The insulating support is formed with a conductive layer on at least one surface thereof, and a semiconductor layer of the present invention is formed on the surface having the conductive layer formed thereon.

For example, when the support is glass, a conductive layer composed of a material such as $SnO_2$, NiCr, Al, Ag, Cr, Mo, Ir, Nb, Ta, V, Ti, Pt, Pb, $In_2O_3$, ITO ($In_2O_3+SnO_2$), ZnO, or an alloy thereof is formed on the surface of the glass; for a synthetic resin sheet such as polyester film, a conductive layer composed of a material such as NiCr, Al, Ag, Pb, Zn, Ni, Au, Cr, Mo, Ir, Nb, Ta, V, Tl, Pt, or an alloy thereof is formed on the surface; and for stainless steel, a conductive layer composed of a material such as NiCr, Al, Ag, Cr, Mo, Ir, Nb, Ta, V, Ti, Pt, Pb, $In_2O_3$, ITO ($In_2O_3+SnO_2$), ZnO, or an alloy thereof is formed on the surface. The forming method may be a vacuum vapor deposition, a sputtering method, or a screen printing method. The surface of the support is desirably smooth, or irregular (textured) with a maximum height of convexities of 0.1 to 1.0 μm. For example, to make the surface of stainless substrate irregular, a method may be used in which a number of glass balls having diameters of 0.1 to 2.0 mm are shot with great force against the surface of the substrate. The thickness of the substrate may be appropriately determined so as to be able to form photovoltaic elements as desired, but when the photovoltaic element is required to have flexibility, the substrate can be made as thin as possible within the range of sufficiently exhibiting the support function. However, in manufacturing and handling the support, the substrate may be usually made 10 μm or above from the standpoint of mechanical strength.

A desirable form of the substrate in the photovoltaic element of the present invention includes a conductive layer (light reflection layer) composed of a metal having a high reflectance in the range from visible light to near infrared, e.g., Ag, Al, Cu, and AlSi. The light reflection layer is suitably formed by vacuum vapor deposition or sputtering. The thickness of the metal layer used for the light reflection layer is from 10 to 5000 nm. To make the surface of light reflection layer irregular, the substrate temperature during the formation thereof may be raised above 200° C.

A further desirable form of the substrate in the photovoltaic element of the present invention includes a transparent conductive layer composed of, e.g., ZnO, $SnO_2$, $In_2O_3$, ITO, $TiO_2$, CdO, $Cd_2SnO_4$, $Bi_2O_3$, $MoO_3$, or $Na_xWO_3$ on the light reflection layer. The forming method of the transparent conductive layer is a vacuum vapor deposition, a CVD method, a spray method, a spin-on method, or a dipping method. Also, the layer thickness is preferably in a range from 50 nm to 10 μm, although the optimal layer thickness varies with the index of refraction of the layer. Further, to make the transparent conductive layer irregular, the substrate temperature during forming of the layer is preferably raised above 200° C.

Doped layers (p-layer, n-layer)

The base material of the doped layer(s) is composed of non-single crystalline silicon type semiconductor. Examples of the amorphous (abbreviated as a-) silicon type semiconductor include a-Si, a-SiGe, a-SiC, a-SiO, a-SiN, a-SiCO, a-SiON, a-SiNC, a-SiGeC, a-SiGeN, a-SiGeO, a-SiCON, and a-SiGeCON.

In particular, for the doped layer on the light incident side, a crystalline semiconductor with less light absorption or an amorphous semiconductor layer with a wide bandgap is suitable. Specific examples include a-SiC, a-SiO, a-SiN, a-SiCO, a-SiON, a-SiNC, and a-SiCON.

When microcrystalline germanium is to be contained in the doped layer, the methods (1) to (3) relying on MWPCVD are suitable. Also, to allow more light to be incident on the i-layer, it is desirable not to contain microcrystalline germanium in the doped layer on the light incident side.

When microcrystalline silicon is to be contained in the doped layer, the methods (1) to (3) relying on the MWPCVD are suitable. Also, to allow more light to be incident on the i-layer, it is desirable not to contain microcrystalline silicon in the doped layer on the light incident side.

The amount of a valence electron control agent to be introduced to convert the conductivity type into the p-type or n-type is preferably in a range from 1000 ppm to 10%. Hydrogen (H,D) and fluorine serve to compensate for dangling bonds, and to enhance the doping efficiency. The content of hydrogen and fluorine is optimally from 0.1 to 30 at %. In particular, when the doped layer is crystalline, the optimal content is from 0.01 to 10 at %. The amount of introduced oxygen and nitrogen atoms is from 0.1 ppm to 20%, or if a smaller amount is to be contained, the preferable range is from 0.1 ppm to 1%.

Of the electric characteristics, the activation energy is preferably 0.2 eV or less, and optimally 0.1 eV or less. Also, the specific resistance is preferably 100 Ωcm or less, and optimally 1 Ωcm or less.

In particular, in forming a crystalline semiconductor with less light absorption or an amorphous semiconductor layer with a wide bandgap as previously described, the source gases are diluted 2 to 100 times with a gas such as $H_2$, $D_2$, or He and a relatively high MW electric power is introduced through the MWPCVD method. Also, if the RFPCVD method is used, it is preferable that a relatively high RF electric power is introduced.

i-layer

In the photovoltaic element of the present invention, the i-layer having substantially i-type conductivity contains microcrystalline germanium having particle diameters of 50 to 500 angstroms and is the most important layer for production and transport of photoexcited carriers. The base material for the i-layer is hydrogen, silicon, or germanium, whether slightly p-type or slightly n-type, and may further contain F, C, N, and O. Hydrogen (H, D) and fluorine contained in the i-layer serve to compensate for dangling bonds, and enhance the production of mobility and lifetime of the charge carriers in the i-layer. Also, they have the effect of compensating for the interfacial level at the interface, and improve the photovoltaic power, the photocurrent, and the light response of the photovoltaic element. The content of hydrogen and fluorine in the i-layer is optimally from 1 to 30 at %. The layer preferably contains from 10 ppm to 20% carbon, from 100 ppm to 10% oxygen, or from 1 ppm to 10% nitrogen.

The i-layer of the present invention has fewer tail states on the valence electron band side, the inclination of the tail states being 60 meV or less, and the density of dangling bonds with electron spin resonance (ESR) being $10^{17}/cm^3$ or less.

The formation of the i-layer is preferably performed by the MWPCVD method, and more preferably by the MWPCVD method including simultaneously introducing RF electric power and DC electric power. Also, the source gas is desirably diluted 2 to 100 times with a gas such as $H_2$, $D_2$, or He.

In the photovoltaic element of the present invention, the i-layer may be constituted of a plurality of layers, wherein one preferred form is the lamination of an RF-i layer and a MW-i layer. An RF-i layer is formed between the MW-i layer and the doped layer, and is an important layer for transporting photoexcited carriers and preventing the valence electron control agent in the doped layer from diffusing into the MW-i layer. The RF-i layer may be made of amorphous silicon type semiconductor, whether slightly p-type or slightly n-type. Examples of the amorphous silicon type semiconductor include a-Si, a-SiC, a-SiO, a-SiN, a-SiCO, a-SiON, a-SiNC, a-SiCON, a-SiGe, a-SiGeC, a-SiGeO, a-SiGeN, a-SiCON, a-SiGeNC, and a-SiGeCON. The RF-i layer on the light incident side may be a semiconductor such as a-Si, a-SiC, a-SiO, and a-SiN to increase the open circuit voltage of the photovoltaic element. The RF-i layer on the opposite side of the light incident side may be a semiconductor such as a-Si to enhance the short-circuit current of the photovoltaic element.

Hydrogen (H, D) and fluorine contained in the RF-i layer serve to compensate for dangling bonds in the i-layer, and enhance the product of mobility and lifetime of carriers in the i-layer. Also, they have the effect of compensating for the interfacial level at the interface, and improve the photovoltaic power, the photocurrent, and the light response of the photovoltaic element. The content of hydrogen and fluorine in the RF-i layer is optimally from 1 to 30 at %. The layer preferably contains from 10 ppm to 20% carbon, from 100 ppm to 10% oxygen, or from 1 ppm to 10% nitrogen.

The layer thickness of the RF-i layer is optimally from 0.5 to 50 nm, with fewer tail states on the valence electron band side, the inclination of tail states being 55 meV or less, and the density of dangling bonds with electron spin resonance (ESR) being $10^{16}/cm^3$ or less.

Also, in forming the RF-i layer, the source gas is desirably diluted 2 to 100 times with a gas such as $H_2$, $D_2$, or He.

Transparent electrode

The transparent electrode may be suitably made of a material such as indium oxide ($In_2O_3$), tin oxide ($SnO_2$), or ITO ($In_2O_3+SnO_2$), to which fluorine may be added.

The deposition of the transparent electrode is optimally performed by sputtering or vacuum vapor deposition.

When sputtering is used for the deposition, an appropriate combination of targets such as a metallic target and an oxide target is used.

When sputtering is used for the deposition, the substrate temperature is an important factor, wherein the preferable range is from 20° to 600° C. Also, when the transparent electrode is deposited by sputtering, the sputtering gas may be an inert gas such as Ar gas. It is preferable to add oxygen gas ($O_2$) to the inert gas as necessary. In particular, when metal is used as the target, oxygen gas ($O_2$) is indispensable. Further, when the target is sputtered by the inert gas, the pressure in the discharge space is preferably in the range from 0.1 to 50 mTorr for effective sputtering. The deposition rate of the transparent electrode depends on the pressure within the discharge space or the discharge electric power, the optimal deposition rate being from 0.01 to 10 nm/sec.

The vapor deposition sources suitable for depositing the transparent electrode by vacuum deposition include metallic tin, metallic indium, and indium-tin alloy. Also, the substrate temperature in depositing the transparent electrode is preferably in a range from 25° to 600° C. Further, it is necessary to introduce oxygen gas ($O_2$), and deposit the electrode at a pressure from $5\times10^{-5}$ Torr to $9\times10^{-4}$ Torr. By introducing oxygen in this range, the metal vaporized from the vapor deposition source can react with oxygen in the vapor phase to deposit a good transparent electrode. The preferable deposition rate for the transparent electrode under the above conditions is from 0.01 to 10 nm/sec. With a deposition rate below 0.01 nm/sec, the productivity decreases, while above 10 nm/sec, the film becomes rough, resulting in lower transmittance, conductivity, and adhesion.

The layer thickness of the transparent electrode is preferably selected to meet the conditions of an antireflection film. Specifically, the layer thickness of the transparent electrode is preferably from 50 to 500 nm.

Collector electrode

To allow more light to be incident upon the pin-type semiconductor which is a photovoltaic layer and to efficiently collect carriers produced, the shape of the collector electrode (as seen from the light incident direction) and its material are important. Normally, the shape of the collector electrode is comb-like, and the width and the number of lines can be determined depending on the shape as seen from the light incident direction of the photovoltaic element, the size, and the material of the collector electrode. The width of the lines may be approximately from 0.1 to 5 mm. The materials of the collector electrodes include Fe, Cr, Ni, Au, Ti, Pd, Ag, Al, Cu, AlSi, and C (graphite), and preferably metals such as Ag, Cu, Al, Cr, C, normally having small specific resistance, or alloys thereof. The collector electrode may consist of a single layer, or a plurality of such layers or a plurality of layers made of different materials. These metals are preferably formed by vacuum vapor deposition, sputtering, plating, or printing. The layer thickness is suitably from 10 nm to 0.5 nm. By vacuum vapor deposition, the collector electrode is formed by placing a mask shaped like the collector electrode in close contact with the transparent electrode, vaporizing a desired metal vapor deposition source in a vacuum by electron beam or resistive heating, and forming the collector electrode having a desired shape on the transparent electrode.

By sputtering, the collector electrode is formed by placing a mask shaped like the collector electrode in close contact with the transparent electrode, introducing Ar gas into a vacuum, applying a DC voltage to a desired metallic target to produce a glow discharge to sputter the metal, and forming the collector electrode having a desired shape on the transparent electrode.

By printing, a screen printing apparatus is used with Ag paste, Al paste, or carbon paste.

While the photovoltaic element of the pin structure has been described above, the present invention is also applicable to the photovoltaic elements having a laminated pin structure such as a pinpin structure or a pinpinpin structure, or to photovoltaic elements having a laminated nip structure such as an nipnip structure or an nipnipnip structure.

The photoelectric conversion element according to the present invention will be described below in detail, exemplifying solar cells or photosensors, to which the present invention is not limitative.

EXAMPLE 1-1

Using a deposition apparatus as shown in FIG. 5, a solar cell configured as in FIG. 1 was fabricated.

First, a substrate was fabricated. A stainless steel substrate having a thickness of 0.5 mm and a size of 50×50 mm² was ultrasonically washed with acetone and isopropanol, and dried by hot air. Using a DC magnetron sputtering method, a 0.3 μm-thick light reflection layer of Ag was formed on the surface of the stainless substrate at room temperature, and then a 1.0 μm-thick transparent conductive layer of ZnO was formed thereon at 350° C. by RF magnetron sputtering, whereby fabrication of the substrate was completed.

The deposition apparatus 200 can carry out both MWPCVD and RFPCVD. Using this apparatus, a pin-type semiconductor was formed on the ZnO transparent conductive layer. The detailed description will be set forth below.

The deposition apparatus is connected to a source gas supply unit (not shown) through a gas introducing tube. The source gas cylinders containing gases refined to super-high purities included a $SiH_4$ gas cylinder, $SiF_4$ gas cylinder, $CH_4$ gas cylinder, $GeH_4$ gas cylinder, $GeF_4$ gas cylinder, $PH_3/H_2$ (dilution: 100 ppm) gas cylinder, $B_2H_6/H_2$ (dilution: 100 ppm) gas cylinder, $H_2$ gas cylinder, and NO/He (dilution: 1%) gas cylinder. The bias power source was an RF power source.

Then, the substrate 204 having a reflection layer and a transparent conductive layer formed thereon was placed with its back surface in close contact with heater 205, leak valve 209 of the deposition chamber 201 was closed, conductance valve 207 was fully opened, and the deposition chamber was evacuated by means of a vacuum evacuation pump (not shown) to a pressure of about $1\times10^{-5}$ Torr.

After the preparation for film formation had been completed, an n-layer (MWPCVD) made of a-Si, an i-layer (MWPCVD (1)) containing microcrystalline germanium, and a p-layer (RFPCVD) made of a-SiC were formed successively. Table 3A lists the forming conditions.

In forming each layer, $H_2$ gas was introduced into the deposition chamber 201, the pressure was regulated by the conductance valve so as to be equal to the desired forming pressure of each layer, and when the substrate temperature became stable at a desired temperature, the necessary amount of source gas was introduced into the deposition chamber. The output power of the RF power source was set to a desired value if RFPCVD was conducted, or the output power of the MW power source was set to a desired value if MWPCVD was conducted, a bias voltage was applied if necessary to excite a plasma, the shutter was opened and then closed after forming a desired layer thickness, and the RF power source or the MW power source was turned off to extinguish the plasma. The inflow of source gas into the deposition chamber was stopped, $H_2$ gas was continuously flowed into the deposition chamber for five minutes and then stopped, the deposition chamber and the gas piping were evacuated to a vacuum of $1\times10^{-5}$ Torr, after which the next layer was formed.

Next, ITO having a layer thickness of 70 nm was deposited as the transparent electrode on the p-layer by vacuum vapor deposition.

Then, a mask with comb-like openings was placed on the transparent electrode, and a collector electrode of a comb shape composed of Cr (40 nm)/Ag (1000 nm)/Cr (40 nm) was formed by vacuum vapor deposition.

With the above, fabrication of solar cell (SC example 1-1) was completed.

EXAMPLE 1-2

In this example, during formation of the i-layer, the flow of $SiH_4$ gas and the flow of $GeH_4$ gas were changed with time. The fabrication of a solar cell (SC example 1-2) was performed in the same way as in Example 1-1, except for the above distinctions. The fabrication conditions are listed in Table 3B.

TABLE 3A

| Layer | n | i | p |
|---|---|---|---|
| Gas flow (sccm) | | | |
| $SiH_4$ | 10 | 140 | 5 |
| $GeH_4$ | | 10 | |
| $CH_4$ | | | 1 |
| $H_2$ | | 300 | 100 |
| $PH_3/H_2$ | 500 | | |
| $B_2H_6/H_2$ | | | 500 |
| Pressure (Torr) | 0.01 | 0.005 | 2.0 |
| Substrate temperature (°C.) | 350 | 430 | 200 |
| MW electric power (W) | 300 | 500 | |
| RF electric power (W) | | 800 | 30 |
| Layer thickness (nm) | 20 | 250 | 10 |

TABLE 3B

| Layer | n | i | p |
|---|---|---|---|
| Gas flow (sccm) | | | |
| $SiH_4$ | 10 | 140→110→140 | 10 |
| $GeH_4$ | | 10→ 40→ 10 | |
| $CH_4$ | | | 1 |
| $H_2$ | | | 100 |
| $PH_3/H_2$ | 500 | | |
| $B_2H_6/H_2$ | | | 500 |
| Pressure (Torr) | 0.01 | 0.005 | 2.0 |
| Substrate temperature (°C.) | 450 | 430 | 200 |
| MW electric power (W) | 400 | 500 | |
| RF electric power (W) | | 800 | 30 |
| Layer thickness (nm) | 30 | 200 | 8 |

Comparative Example 1-1-1

A solar cell (SC comp. 1-1-1) was fabricated under the same conditions as in Example 1-1, except that the substrate temperature was 380° C. during formation of the i-layer.

Comparative Example 1-1-2

A solar cell (SC comp. 1-1-2) was fabricated under the same conditions as in Example 1-2, except that the substrate temperature was 380° C. during formation of the i-layer.

Comparative Example 1-2-1

A solar cell (SC comp. 1-2-1) was fabricated under the same conditions as in Example 1-1, except that the substrate temperature was 630° C. during formation of the i-layer.

Comparative Example 1-2-2

A solar cell (SC comp. 1-2-2) was fabricated under the same conditions as in Example 1-2, except that the substrate temperature was 630° C. during formation of the i-layer.

Evaluation 1

The initial photoelectric conversion efficiencies (photovoltaic power/incident light power) of the solar cells (SC ex. 1-1), (SC comp. 1-1-1) and (SC comp. 1-2-1) were measured. The measurement of the initial photoelectric conversion efficiency was conducted by placing the solar cells under light illumination of AM-1.5 (100 mW/cm$^2$) and measuring the V-I characteristic.

As a result of the measurements, the initial photoelectric conversion efficiencies of (SC ex. 1-2), (SC comp. 1-1-1), (SC comp. 1-1-2), (SC comp. 1-2-1), and (SC comp. 1-2-2)

relative to (SC ex. 1-1) were 1.05, 0.91, 0.90, 0.89, and 0.88, respectively.

Next, the i-layer was analyzed, for which Raman scattering was measured using a sample having the i-layer of (SC ex. 1-1) on the glass substrate. A sharp peak corresponding to microcrystalline germanium having a Raman shift of 300 cm$^{-1}$ and a broad peak corresponding to amorphous silicon having a Raman shift of 480 cm$^{-1}$ were observed. Also, the crystallinity was evaluated from the electron beam diffraction, and a sharp ring was observed in a broad ring for each sample. Also, in the observation with a high resolution electron microscope, microcrystalline regions having particle diameters of 60 to 470 angstroms corresponding to microcrystalline germanium were observed. Also, with the same samples corresponding to (comp. 1-1-1) and (comp. 1-2-1), ultramicrocrystalline regions having particle diameters of 10 to 40 angstroms corresponding to microcrystalline germanium were detected in the high resolution electron microscope observation. With a sample of (comp. 1-2-1), microcrystalline regions having particle diameters of 600 to 900 angstroms were observed.

In this way, it was found that the solar cell (SC ex. 1-1) of the present invention had better characteristics than the solar cells (SC comp. 1-1-1) and (SC comp. 1-2-1) of the comparative examples.

Evaluation 2

The initial photoelectric conversion efficiencies (photovoltaic power/incident light power) of the solar cells (SC ex. 1-2), (SC comp. 1-1-2) and (SC comp. 1-2-2) were measured. The measurement of the initial photoelectric conversion efficiency was conducted by placing the solar cells under light illumination of AM-1.5 (100 mW/cm$^2$) and measuring the V-I characteristic. As a result of the measurements, the initial photoelectric conversion efficiencies of (SC comp. 1-1-2) and (SC comp. 1-2-2) relative to (SC ex. 1-2) were 0.89 and 0.88, respectively.

Next, the i-layer was analyzed. Samples as listed in the following table (Table 4) were fabricated on glass substrates.

TABLE 4

| Sample | Gas flow (sccm) | | |
|---|---|---|---|
| | SiH$_4$ | GeH$_4$ | H$_2$ |
| SP-1 | 140 | 10 | 300 |
| SP-2 | 130 | 20 | 300 |
| SP-3 | 120 | 30 | 300 |
| SP-4 | 110 | 40 | 300 |
| SP-5 | 100 | 50 | 300 |

The fabrication was performed under the same conditions as those of Example 1-2, except for the gas flow. Raman scattering was measured using samples (SP-1) to (SP-5) and a sharp peak corresponding to microcrystalline germanium having a Raman shift of 300 cm$^{-1}$ and a broad peak corresponding to amorphous silicon having a Raman shift of 480 cm$^{-1}$ were observed. Also, the crystallinity was evaluated from the electron beam diffraction, and a sharp ring was observed in a broad ring for each sample. Also, in the observation with a high resolution electron microscope, microcrystalline regions corresponding to microcrystalline germanium were observed. Thereby, it was found that a greater flow of GeH$_4$ results in more microcrystalline regions having particle diameters of 60 to 470 angstroms, increasing the content of microcrystalline germanium.

Accordingly, it has been determined that the content of microcrystalline germanium in the i-layer of (SC ex. 1-2) changes as shown in FIG. 9A. Also, the measurement of bandgap using a spectrophotometer revealed that the variation of bandgap in the layer thickness direction for (SC ex. 1-2) was as shown in FIG. 10A.

Also, the same analysis was performed using identical samples of (comp. 1-1-2) and (comp. 1-2-2). As a result, with a sample of (comp. 1-1-2), ultramicrocrystalline regions having particle diameters of 10 to 40 angstroms corresponding to microcrystalline germanium were detected in the high resolution electron microscope observation. With a sample of (comp. 1-2-2), microcrystalline regions having particle diameters of 640 to 1000 angstroms were observed. Also, the variation of bandgap in the layer thickness direction was similar to that of (SC ex. 1-2).

In this way, it was found that the solar cell (SC ex. 1-2) of the present invention has better characteristics than the conventional solar cells (SC comp. 1-1-2) and (SC comp. 1-2-2).

EXAMPLE 2-1

Figure 8:
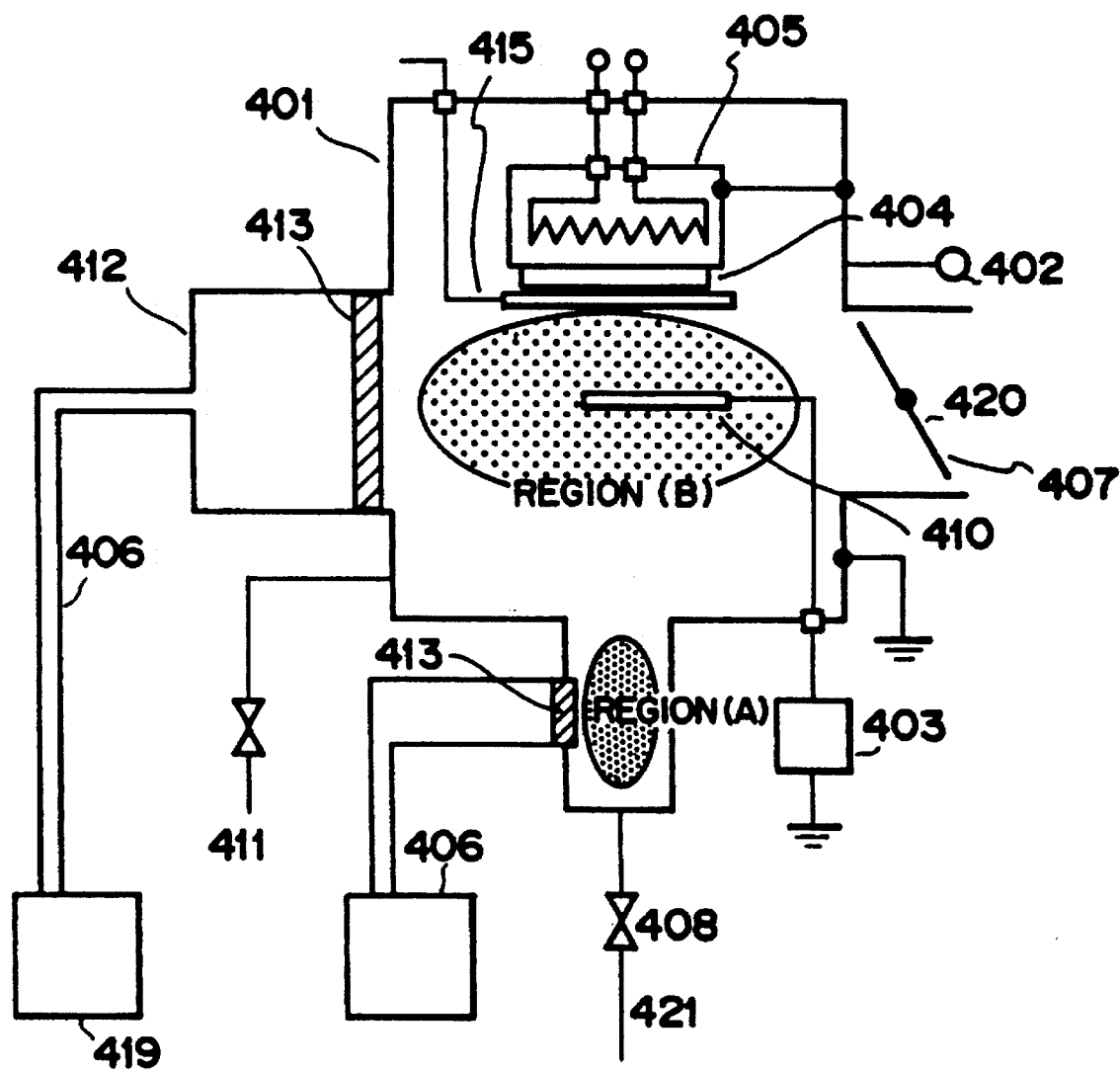
FIG. 8 is a schematic view of a deposition apparatus for use in manufacturing photoelectric conversion elements of the present invention.

An i-layer containing microcrystalline germanium was formed in a deposition apparatus 400 of FIG. 8 using the forming method (3) as previously described. This deposition apparatus was a partial modification of the deposition apparatus 200 of FIG. 5, wherein the basic usage is the same. In forming an i-layer, GeH$_4$ gas was introduced through a gas introducing tube 421 to excite a plasma of GeH$_4$ gas in a plasma region (A) separate from a plasma region (B). The plasma excitation conditions in the plasma region (A) included a GeH$_4$ gas flow of 10 sccm, a pressure of 80 mTorr, and a MW electric power of 300 W, and the conditions in the plasma region (B) were the same of those of Example 1-1, except for the substrate temperature of 420° C. Measurements equivalent to those of Example 1-1 revealed that the solar cell of this example (SC ex. 2-1) had better characteristics than the solar cell (SC comp. 1-1-1) of the comparative example, as with Example 1-1. Analysis of the i-layer was performed by the same method as Example 1-1, and the existence of microcrystalline germanium was confirmed as Example 1.

EXAMPLE 2-2

In this example, in forming the i-layer, GeH$_4$ gas was introduced through gas introducing tube 421 to excite a plasma of GeH$_4$ gas in a plasma region (A) and excite a plasma of SiH$_4$ gas and GeH$_4$ gas in a plasma region (B), so that the plasma region (A) and the plasma region (B) are spatially separated. The plasma excitation conditions in the plasma region (A) were such that the pressure was 80 mTorr and the MW electric power was 300 W, and the GeH$_4$ gas flow was changed with time, as in Example 1-2, while the conditions in the plasma region (B) were the same as those of Example 1-2, except that the substrate temperature was 430° C. The same measurements were performed on Example 1-2. It was found that the solar cell (SC ex. 2-2) of this example had better characteristics than the solar cells (SC comp. 1-1-2) and (SC comp. 1-2-2) of the comparative examples, as with Example 1-2. Analysis of the i-layer was performed by the same method of Example 1-2, and the existence of microcrystalline germanium was confirmed as with Example 1-2, with its content changing in the layer thickness direction as shown in FIG. 9A.

EXAMPLE 3-1

A photodiode for an infrared photosensor having the layer constitution of FIG. 1 was fabricated. A glass substrate having a thickness of 0.5 mm and a size of 50×50 mm² was ultrasonically washed with acetone and isopropanol and dried by hot air, and a 0.1 μm-thick light reflection layer of Al was formed on the surface of the glass substrate at room temperature by vacuum vapor deposition, whereby the fabrication of the substrate was completed.

By the same method of Example 1-1, there were successively formed on the substrate a p-layer (a-Si layer 50 nm thick), a i-layer (containing mc-Ge, with a substrate temperature of 450° C. and a layer thickness of 600 nm), and an n-layer (a-SiC layer 20 nm thick). Then, a transparent electrode and a collector electrode as in Example 1-1 were formed on the n-layer, whereby a photodiode (PD ex. 301) was fabricated.

EXAMPLE 3-2

The fabrication of a substrate was performed in the same way as in Example 3-1.

By the same method of Example 1-2, on the substrate there were successively formed a p-layer (a-Si layer 50 nm thick), an i-layer (containing a-SiGe:mc-Ge, with a substrate temperature of 450° C. and a layer thickness of 600 nm), and an n-layer (a-SiC layer 20 nm thick). Then, a transparent electrode and a collector electrode as in Example 1-2 were formed on the n-layer, whereby a photodiode (PD ex. 3-2) was fabricated.

Comparative Example 3-1-1

A photodiode (PD comp. 3-1-1) was fabricated under the same conditions as those of Example 3-1, except that the substrate temperature was 380° C. during fabrication of the i-layer.

Comparative Example 3-1-2

A photodiode (PD comp. 3-1-2) was fabricated under the same conditions as those of Example 3-2, except that the substrate temperature was 350° C. during formation of the i-layer.

Comparative Example 3-2-1

A photodiode (PD comp. 3-2-1) was fabricated under the same conditions as those of Example 3-1, except that the substrate temperature was 620° C. during formation of the i-layer.

Evaluation 3

The on/off ratio of the fabricated photodiodes was measured. The on/off ratio was obtained by measuring the photocurrent/dark current (measurement frequency 10 kHz) under illumination of infrared rays from a GaAlAs-LED (central wavelength 880 nm). Also, the temperature characteristic was measured.

As a result, it was found that the photodiode (PD ex. 3-1) of the present invention has better characteristics than the photodiodes (PD comp. 3-1-1) and (PD comp. 3-2-1).

A sample of the i-layer identical to that of Example 1-1 was fabricated and analyzed. It was found that (PD ex. 3-1) contains microcrystalline germanium having particle diameters of 80 to 440 angstroms.

Comparative Example 3-2-2

A photodiode (PD comp. 3-2-2) was fabricated under the same conditions as those of Example 3-2, except that the substrate temperature was 620° C. during formulation of the i-layer.

Evaluation

The on/off ratio of the fabricated photodiodes was measured. The on/off ratio was obtained by measuring the photocurrent/dark current (measurement frequency 10 kHz) under illumination of infrared rays from a GaAlAs-LED (central wavelength 880 nm). Also, the same measurement was made under an oscillating environment having a frequency of 60 Hz and an amplitude of 0.2 mm. As a result, it was found that the photodiode (PD ex. 3-2) of the present invention has better characteristics that the photodiodes (PD comp. 3-1-2) and (PD comp. 3-2-2). This is due to the short-circuit photocurrent and the enhanced FF. A sample of the i-layer identical to that of Example 1-2 was fabricated and analyzed. It was found that (PD ex. 3-2) contains microcrystalline germanium having particle diameters of 60 to 470 angstroms, and the content is as shown in FIG. 10A.

Example 4-1

A solar cell (SC ex. 4-1) was fabricated by using $Si_2H_6$ gas instead of $SiH_4$ gas. This solar cell was fabricated in the same way as in Example 1-1, except that $Si_2H_6$ gas was introduced at 70 sccm instead of $SiH_4$ gas as in Example 1-1. And the same measurements as for Example 1-1 were performed. It was found that this solar cell has better characteristics than the solar cells (SC comp. 1-1-1) to (SC com. 1-3-1).

EXAMPLE 4-2

A solar cell (SC ex. 4-2) was fabricated by using $Si_2H_6$ gas instead of $SiH_4$ gas. This solar cell was fabricated in the same way as in Example 1-2, except that $Si_2H_6$ gas was introduced, instead of $SiH_4$ gas as in Example 1-2, by changing the amount from 70 to 55 to 70 sccm. And the same measurements as in Example 1-2 were performed. Thereby, it was found that this solar cell has better characteristics than the conventional solar cells (SC comp. 1-1-2) to (SC comp. 1-3-2).

EXAMPLE 5-1

A solar cell (SC ex. 5-1) containing both microcrystalline silicon and microcrystalline germanium in the i-layer was fabricated using method (II). This solar cell was fabricated under the same conditions as in Example 1-1, except that in forming the i-layer, $SiF_4$ gas (30 sccm) was introduced.

The same measurements as in Example 1-1 were performed. Thereby, it was found that this solar cell has better characteristics than the solar cells (SC ex. 5-1) and (SC ex. 1-1).

Also, by analyzing the i-layer from Raman scattering, Raman shifts having a sharp peak of 520 $cm^{-1}$ corresponding to microcrystalline silicon and a sharp peak of 300 $cm^{-1}$ corresponding to microcrystalline germanium were observed.

EXAMPLE 5-2

A solar cell (SC ex. 5-2) containing both microcrystalline silicon and microcrystalline germanium and having the i-layer was fabricated using method (II). This solar cell was fabricated under the same conditions as in Example 1, except that in forming the i-layer, $SiF_4$ gas (30 sccm) was introduced.

The same measurements as in Example 1-2 were performed. Thereby, it was found that this solar cell has better characteristics than the solar cells (SC ex. 5-2) and (SC ex. 1-2). Also, analyzing the i-layer by Raman scattering, Raman shifts having a sharp peak of 520 $cm^{-1}$ corresponding to microcrystalline silicon and a sharp peak of 300 $cm^{-1}$ corresponding to microcrystalline germanium were observed.

EXAMPLE 6-1

A solar cell containing both microcrystalline silicon and microcrystalline germanium in the n-layer was fabricated using method (II). This solar cell was fabricated under the same conditions as in Example 1-1, except that in forming the n-layer, $GeF_4$ gas (1 sccm) was introduced and the MW electric power was 500 W.

The same measurements as for Example 1-1 were performed. Thereby, it was found that this solar cell has better characteristics than the solar cells (SC ex. 6-1) and (SC ex. 1-1). Also, by analyzing the i-layer by Raman scattering in the same way as in Example 1-1, Raman shifts having a sharp peak of 520 $cm^{-1}$ corresponding to microcrystalline silicon and a sharp peak of 300 $cm^{-1}$ corresponding to microcrystalline germanium were observed.

EXAMPLE 6-2

A solar cell containing both microcrystalline silicon and microcrystalline germanium with the content of microcrystalline silicon changing in the layer thickness direction was fabricated using method (II). This solar cell was fabricated under the same conditions as in Example 1-2, except that in forming the i-layer, $SiF_4$ gas was introduced, the flow was changed with the time, and the substrate temperature was 470° C.

The same measurements as for Example 1-2 were performed. Thereby, it was found that this solar cell (SC ex. 6-2) has better characteristics than the solar cell (SC ex. 5-2). Also, by analyzing the i-layer by Raman scattering in the same way as in Example 1, Raman shifts having a sharp peak of 520 $cm^{-1}$ corresponding to microcrystalline silicon and a sharp peak of 300 $cm^{-1}$ corresponding to microcrystalline germanium were observed. A sample was fabricated in the same way as in Example 1-2, and microcrystalline regions corresponding to microcrystalline silicon were observed. Thereby, it was found that the content of microcrystalline silicon in the layer thickness direction is as shown in FIG. 11A.

EXAMPLE 7-1

Figure 6:
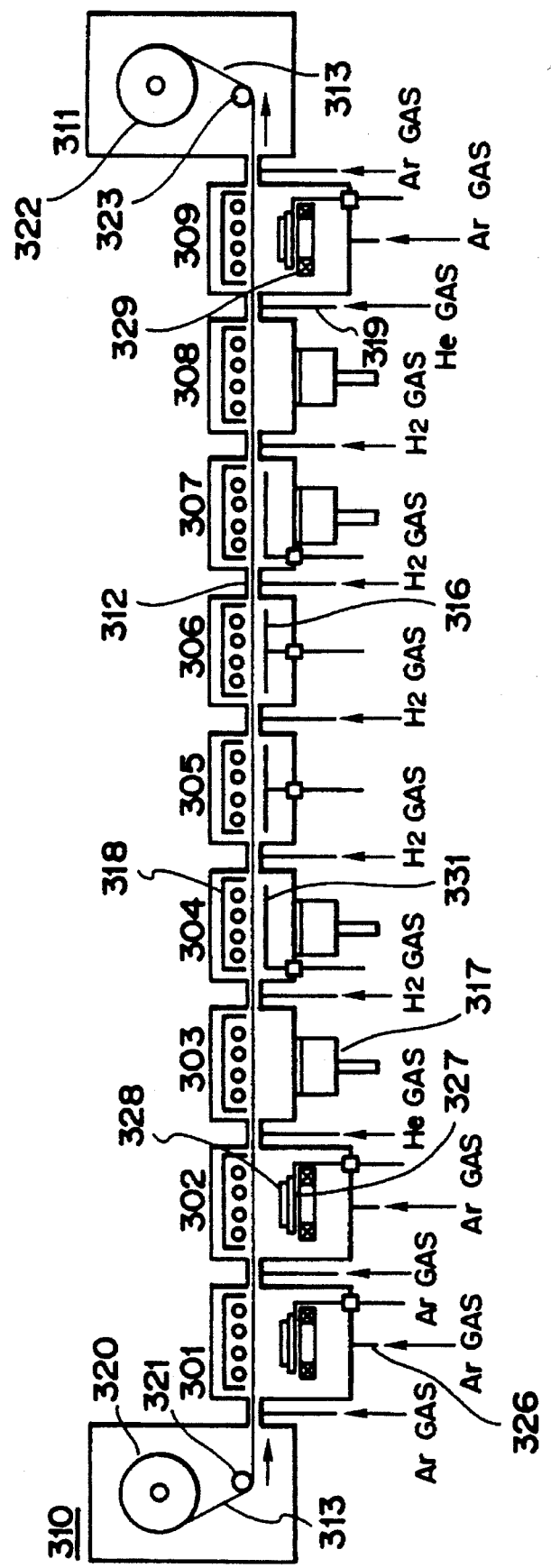
FIG. 6 is a schematic view of a roll-to-roll deposition apparatus for use in manufacturing photoelectric conversion elements of the present invention.

A pinpin-type tandem solar cell (SC ex. 7-1) of the type shown in FIG. 4 was fabricated using a deposition apparatus in accordance with the roll-to-roll method of FIG. 6. This apparatus is comprised of a substrate delivery chamber 310, a plurality of deposition chambers 301 to 309, and a substrate winding chamber 311 arranged in succession via separation passages 312 for connection therebetween, wherein a strip-like substrate 313 passes continuously from the substrate delivery chamber to the substrate winding chamber to form each deposited film concurrently in each deposition chamber.

Figure 7A:
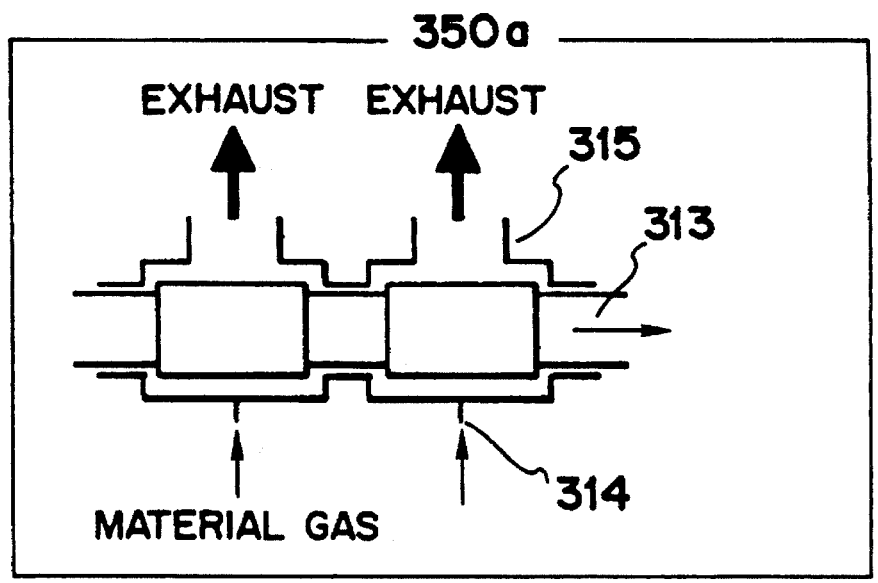
FIGS. 7A and 7B are plan views of a deposition chamber as shown in FIG. 6.

DC magnetron sputtering can be performed in the deposition chamber 301. Also, RF magnetron sputtering can be performed in the deposition chambers 302, 309. Also, microwave plasma CVD can be performed by attaching microwave applicators to the deposition chambers 303, 304, 307, 308. Further, RF plasma CVD can be performed by disposing RF electrodes inside the deposition chambers 305, 306. In each deposition chamber, a halogen lamp heater 318 is disposed for the heating of the substrate. In FIG. 7A, 350a is a view from above the deposition chambers 303 to 308, each deposition chamber having a gas inlet opening 314 and an exhaust opening 315. The gas exhausting in each deposition chamber is in a direction toward the back side of the paper. An Ar gas inlet opening 326 is present in each of the deposition chambers 301, 302, 309, and an inlet opening 314 for source gas to form deposited films by plasma CVD is present in each of the deposition chambers 303 to 308, and connects to a source gas supply unit identical to that of Example 1-1.

A mechanical booster as the vacuum exhaust pump is connected to each of the exhaust openings of the deposition chambers 305, 306, and an oil diffusion pump is connected to each of the other deposition chambers, the substrate delivery chamber, and the substrate winding chamber. Also, an RF power source is connected to the RF electrodes, and an MW power source is connected to the microwave applicators. Further, a bias electrode 331 is installed in each of the deposition chambers 304 and 307 for the i-layer, and connected to a DC power source.

The target for the deposition chamber 301 was made of Ag, the target for the deposition chamber 302 was made of ZnO, and the target for the deposition chamber 309 was made of $In_2O_3+SnO_2$ (5%). The separation passage connecting each deposition chamber has an inlet opening 319 for the inflow of scavenging gas to cause a scavenging gas as shown in FIG. 5 to flow in. The substrate delivery chamber has a guide roller 321 to apply an adequate tension to the delivery roll 320 and the substrate to hold them horizontal at any time, and the substrate winding chamber has a winding roll 322 and a guide roller 323.

First, a long stainless sheet 300 m long, 50 cm wide, and 0.1 mm thick was wound around the delivery roll and then set in the substrate delivery chamber. After passing the substrate through each deposition chamber, the end portion of the substrate was wound around the substrate winding roll. The whole apparatus was evacuated of air by a vacuum evacuation pump, and the lamp heater of each deposition chamber was turned on and set so that the substrate temperature within each deposition chamber was at a predetermined temperature. If the pressure of the whole apparatus fell below 1 mTorr, each scavenging gas was flowed in through the inlet opening 319 for scavenging gas, the substrate was wound around the winding roll while moving in the direction of the arrow as indicated in the figure, and a predetermined amount of Ar gas was flowed into each of the deposition chambers 301, 302, and 309. Further, respective source gases were flowed into the other deposition chambers. In this case, the flow rate of scavenging gas passed through the separation passage and the pressure of each deposition chamber were regulated so that the source gas flowed into each deposition chamber did not diffuse into the other deposition chambers. Then, DC electric power, RF electric power, or MW electric power was introduced into each deposition chamber to excite a plasma to effect sputtering in the deposition chambers 301, 302, 309, RFPCVD in the deposition chambers 305, 306, and MWPCVD in the other deposition chambers, thereby continuously forming each deposited film in each deposition chamber.

On the substrate, a light reflection layer (Ag, substrate temperature 350° C., film thickness 0.3 μm) was formed in deposition chamber 301; further, a transparent conductive layer (ZnO, substrate temperature 350° C., film thickness 2.0 μm) was formed in deposition chamber 302; an n1-type layer (P doped a-Si, layer thickness 30 nm) was formed in deposition chamber 303; an i1-type layer (containing mc-Ge:mc-Si, layer thickness 180 nm, substrate temperature 480° C.) was formed in deposition chamber 304; a first p1-type layer (B doped a-Si, layer thickness 10 nm) was formed in deposition chamber 305; a second n2-type layer (P doped a-Si layer, 20 nm thick) was formed in deposition chamber 306; an i2-type layer (a-Si, layer thickness 250 nm) was formed in deposition chamber 307; a second p2-type layer (B doped a-SiC, layer thickness 5 nm) was formed in deposition chamber 308; and a transparent electrode (ITO, substrate temperature 160° C., layer thickness 70 nm) was formed in deposition chamber 309. When the substrate was completely wound up on roll 322, the plasma was extinguished, the introduction of all gases was stopped, the deposition chamber was evacuated of air so that its internal pressure fell below 0.1 mTorr, the whole deposition apparatus was leaked, and the rolled-up substrate was taken out. The surface irregularity was examined by means of a tracer film thickness meter, and there were detected irregularities having an average height of convexities of 0.22 μm. It is considered that the irregular surface was caused by the substrate temperature being as high as 350° C. during formation of the light reflection layer of Ag and the transparent conductive layer of ZnO.

Next, a collector electrode having a two-layer structure was formed by a screen printing apparatus in accordance with the roll-to-roll method. First, a comb-like carbon paste having a thickness of about 3 μm was printed on the surface of a transparent electrode of ITO, and then dried. Next, a similar shaped Ag paste having a thickness of about 10 μm was printed on the surface of carbon paste, and dried, and the collector electrode was cut in a size of 10 cm×25 cm.

EXAMPLE 7-2

Figure 7B:
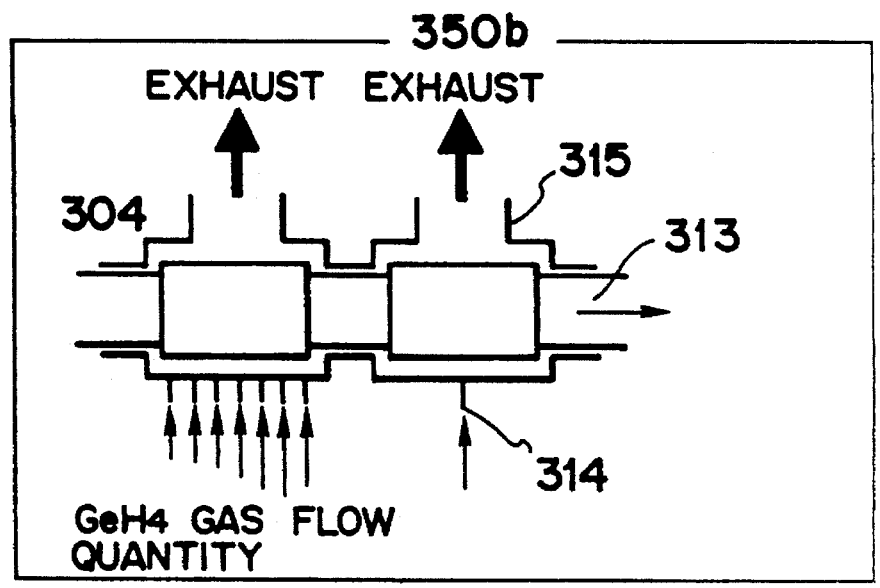

This example involved using an apparatus having a construction as shown in FIG. 7B, which is a view from above a deposition chamber. In particular, 350b is a view from above deposition chamber 304, wherein there are a plurality of gas introducing tubes, and the content of microcrystalline germanium within the i-layer formed can be changed in the layer thickness direction by changing the flow of GeH$_4$ gas through each gas introducing tube. In 350b, the flow of GeH$_4$ gas is indicated by the length of the arrow.

A long stainless steel substrate identical to that of Example 7-1 was employed, and each deposited film was continuously formed in each deposition chamber concurrently.

On the substrate, a light reflection layer (Ag, substrate temperature 350° C., film thickness 0.3 μm) was formed in deposition chamber 301; further, a transparent conductive layer (ZnO, substrate temperature 350° C., film thickness 2.0 μm) was formed in deposition chamber 302; an n1-type layer (P doped a-Si, layer thickness 30 nm) was formed in deposition chamber 303; a first i1-type layer (mc-Ge contained, layer thickness 120 nm, substrate temperature 430° C., DC voltage 250 V) was formed in deposition chamber 304; a first p1-type layer (B doped a-Si, layer thickness 20 nm) was formed in deposition chamber 305; a second n2-type layer (P doped a-Si, layer thickness 20 nm) was formed in deposition chamber 306; an i2-type layer (a-Si, layer thickness 220 nm) was formed in deposition chamber 307; a second p2-type layer (B doped a-SiC, layer thickness 5 nm) was formed in deposition chamber 308; and a transparent electrode (ITO, substrate temperature 160° C., layer thickness 70 nm) was formed in deposition chamber 309. In forming the i1-layer, the flow of GeH$_4$ was changed with time, and the content of microcrystalline germanium was changed as shown in FIG. 9C.

When the substrate was fully wound up on the roll 322, the plasma was extinguished, the introduction of all gases was stopped, the deposition chamber was evacuated of air so that its internal pressure fell below 0.1 mTorr, the whole deposition apparatus was leaked, and the rolled-up substrate was taken out. The surface irregularity was examined by means of a tracer film thickness meter, and there were detected irregularities having an average height of convexities of 0.23 μm. It is considered that this textured film was caused by a substrate temperature as high as 350° C. during formation of the light reflection layer of Ag and the transparent conductive layer of ZnO. Next, a collector electrode having a two-layer structure was formed by a screen printing apparatus relying on the roll-to-roll method. First, a comb-like carbon paste having a thickness of about 3 μm was printed on the surface of transparent electrode of ITO, and then dried. Then, a similarly shaped Ag paste having a thickness of about 10 μm was printed on the surface of carbon paste and dried, and the collector electrode was cut in a size of 10 cm×25 cm.

Comparative Example 7-1-1

A solar cell of the tandem junction pinpin-type (SC comp. 7-1-1) was fabricated under the same conditions as those of Example 7-1, except that the substrate temperature for the i1-layer formation was 350° C.

Comparative Example 7-1-2

A solar cell of tandem junction pinpin-type (SC comp. 7-1-2) was fabricated under the same conditions as those of Example 7-2, except that the substrate temperature for the i1-layer formation was 340° C.

Comparative Example 7-2-1

A solar cell of the tandem junction pinpin-type (SC comp. 7-2-1) was fabricated under the same conditions as those of Example 7-1, except that the substrate temperature for the i1-layer formation was 650° C.

The same measurements as for Example 1-1 showed that (SC ex. 7-1) had better characteristics than (SC comp. 7-1-1) and (SC comp. (7-2-1).

Comparative Example 7-2-2

A solar cell of the tandem junction pinpin-type (SC comp. 7-2-2) was fabricated under the same conditions as those of Example 7-2, except that the substrate temperature for the i1-layer formation was 630° C.

The same measurements as for Example 1-2 showed that (SC ex. 7-2) had better characteristics than (SC comp. 7-1-2) and (SC comp. 7-2-2).

EXAMPLE 8-1

Solar cells of the tandem junction pinpin-type as fabricated in Example 7-1 were modularized, and subjected to a field test. Sixty-five solar cells (SC ex. 7-1) 10 cm×25 cm in size, to which light was not illuminated, as fabricated in Example 7, were prepared. An adhesive sheet composed of EVA (ethylene vinyl acetate) was laid on a 5.0 mm-thick aluminum plate, a nylon sheet was laid thereon, and the sixty-five solar cells were arranged thereon in serial and/or parallel connection adapted to a load. An adhesive sheet of EVA was laid thereon, a fluororesin sheet was laid thereon, and a module (MJ ex. 8-1) was fabricated through vacuum lamination.

EXAMPLE 8-2

Solar cells of the tandem junction pinpin-type as fabricated in Example 7-2 were modularized, and subjected to a field test. Sixty-five solar cells (SC ex. 7-2) 10 cm×25 cm in size, to which light was not illuminated, as fabricated in Example 7, were prepared. An adhesive sheet composed of EVA (ethylene vinyl acetate) was laid on a 5.0 mm-thick aluminum plate, a nylon sheet was laid thereon, and the sixty-five solar cells were arranged thereon in serial and/or parallel connection adapted to a load. An adhesive sheet of EVA was laid thereon, a fluororesin sheet was laid thereon, and a module (MJ ex. 8-2) was fabricated through vacuum lamination.

Comparative Example 8-1-1

A module (MJ comp. 8-1-1) was fabricated under the same conditions as those of Example 8-1, using sixty-five solar cells (SC comp. 7-1-1) unilluminated by light.

Comparative Example 8-1-2

A module (MJ comp. 8-1-2) was fabricated under the same conditions as those of Example 8-2, using sixty-five solar cells (SC comp. 7-1-2) unilluminated by light.

Comparative Example 8-2-1

A module (MJ comp. 8-2-1) was fabricated under the same conditions as those of Example 8-1, using sixty-five solar cells (SC comp. 7-2) unilluminated by light.

Evaluation MJ1

Two modules (MJ comp. 8-1-1) and (MJ comp. 8-2-1) were installed at an angle where solar rays were best converged. The field test was performed by measuring the photoelectric conversion efficiency after the lapse of one year and obtaining the degradation rate (photoelectric conversion efficiency after one year/initial photoelectric conversion efficiency).

As a result, it was found that the module (MJ ex. 8-1) using the solar cells of the present invention had better initial photoelectric conversion efficiency and field durability than the conventional modules (MJ comp. 8-1-1) and (MJ comp. 8-2-1).

Evaluation MJ2

Two modules (MJ comp. 8-1-2) and (MJ comp. 8-2-2) were installed at an angle where solar rays were best converged. The field test was performed by measuring the photoelectric conversion efficiency after the lapse of one year and obtaining the degradation rate (photoelectric conversion efficiency after one year/initial photoelectric conversion efficiency).

As a result, it was found that the module (MJ ex. 8-2) using the solar cells of the present invention had better initial photoelectric conversion efficiency and field durability than the conventional modules (MJ comp. 8-1-2) and (MJ comp. 8-2-2).

As described above, it has been found that the effects of the present invention can be exhibited without regard to the element, element constitution, and element material.

As described above, the photovoltaic elements of the present invention have enhanced long wavelength sensitivity and fill factor and improved photoelectric conversion efficiency. Further, the present invention can reduce light deterioration, and provide a higher field durability and an excellent temperature characteristic. Also, a photosensor using the photovoltaic element of the present invention has reduced residual images and oscillation degradation. Also, the photovoltaic elements of the present invention have high productivity because of their formation using microwave plasma CVD.

What is claimed is:

1. A photoelectric conversion element comprising a non-single crystalline silicon containing semiconductor layer having p-type conductivity, a non-single crystalline silicon-germanium semiconductor layer having i-type conductivity, and a non-single crystalline silicon-containing semiconductor layer having n-type conductivity, characterized in that said i-type semiconductor layer contains microcrystalline germanium having particle diameters of 50 to 500 angstroms.

2. A photoelectric conversion element according to claim 1, characterized in that said i-type layer is formed at a temperature from 400° to 600° C. using microwave plasma CVD.

3. A photoelectric conversion element according to claim 1, characterized in that said p-type and/or n-type crystalline silicon containing semiconductor layer is amorphous.

4. A photoelectric conversion element according to claim 1, characterized in that said p-type and/or n-type crystalline silicon containing semiconductor layer further contains hydrogen.

5. A photovoltaic element according to claim 1, characterized in that the content of said microcrystalline germanium varies in the thickness direction of said i-type layer.

6. A photoelectric conversion element according to claim 1, characterized in that said p-type layer and/or n-type layer is formed at a substrate temperature of 400° to 600° C., using microwave plasma CVD, and contains microcrystalline germanium, the particle diameters of said microcrystalline germanium ranging from 50 to 500 angstroms.

7. A photoelectric conversion element according to claim 1, characterized in that said p-type layer and/or n-type layer is formed by a process wherein a separate plasma region (AA) where a plasma is excited by directing microwave radiation to a gas containing germanium, and a plasma region (BB) where a plasma is excited by directing microwave radiation to a mixture of a gas containing silicon and a gas containing germanium, radicals "Rge" containing germanium produced in the region (AA) and radicals "Rr" containing silicon and/or germanium produced in the region (BB) are reacted in a region (CC) different from said region (AA), and said p-type layer and/or said n-type layer contains microcrystalline germanium, the particle diameter of microcrystalline germanium ranging from 50 to 500 angstroms.

8. A photoelectric conversion element according to claim 7, characterized in that said region (CC) is a substrate or i-type layer surface.

9. A photoelectric conversion element according to claim 1, characterized in that said i-type layer contains microcrystalline silicon, the particle diameters of said microcrystalline silicon ranging from 50 to 500 angstroms.

10. A photoelectric conversion element according to claim 9, characterized in that the content of microcrystalline silicon in said i-type layer varies in the layer thickness direction, and the position at which the content is at a minimum resides between the central position of the i-type layer and the p-type layer.

11. A photoelectric conversion element according to claim 1, characterized in that said p-layer and/or n-type layer contain microcrystalline silicon, the particle diameters of said microcrystalline silicon ranging from 50 to 500 angstroms.

12. A photoelectric conversion element according to claim 1, characterized in that the position at which the content of said microcrystalline germanium is at a maximum resides between the central position in the thickness direction of the i-type layer and the p-type layer.

13. A photovoltaic element wherein a p-layer composed of p-type non-single crystalline silicon semiconductor layer containing hydrogen, an i-type layer composed of i-type amorphous silicon-germanium semiconductor containing hydrogen, and an n-type layer composed of n-type amorphous silicon containing semiconductor containing hydrogen are laminated on a substrate, the i-type layer being formed by microwave plasma CVD, characterized in that said i-type layer is formed by a process wherein a separate plasma region (A) where a plasma is excited by directing microwave radiation to a gas containing germanium, and a plasma region (B) where a plasma is excited by directing microwave radiation to a gas containing silicon and germanium, radicals "Rg" containing germanium produced in said region (A) and radicals "R" containing silicon and/or germanium produced in said region (B) are reacted in a region (C) different from said region (A), and said i-type layer contains microcrystalline germanium, the particle diameters of said microcrystalline germanium ranging from 50 to 500 angstroms.

14. A photoelectric conversion element according to claim 13, characterized in that said region (C) is a p-layer or n-layer surface.

15. A photovoltaic element according to claim 13, characterized in that the content of said microcrystalline germanium varies in the thickness direction of said i-type layer.

16. A photovoltaic element according to claim 13, characterized in that said p-type layer and/or n-type layer is formed at a substrate temperature of 400° to 600° C. using microwave plasma CVD and contains microcrystalline germanium, the particle diameter of said microcrystalline germanium ranging from 50 to 500 angstroms.

17. A photovoltaic element according to claim 13, characterized in that said i-type layer contains microcrystalline silicon, the particle diameters of said microcrystalline silicon ranging from 50 to 500 angstroms.

18. A photovoltaic element according to claim 13, characterized in that said p-type layer and/or n-type layer contain microcrystalline silicon, the particle diameters of said microcrystalline silicon ranging from 50 to 500 angstroms.

19. A photovoltaic element according to claim 13, characterized in that the position at which the content of said microcrystalline germanium is at a maximum resides between the central position in the thickness direction of the i-type layer and the p-type layer.

* * * * *

UNITED STATES PATENT AND TRADEMARK OFFICE
CERTIFICATE OF CORRECTION

PATENT NO. : 5,456,762
DATED : October 10, 1995
INVENTOR(S) : TOSHIMITSU KARIYA, ET AL.  Page 1 of 2

It is certified that error appears in the above-identified patent and that said Letters Patent is hereby corrected as shown below:

COLUMN 2

Line 14, "Y. Hattori D." should read --Y. Hattori, D.-- and "K. Katou Y." should read --K. Katou, Y.--.

COLUMN 5

Line 1, "and" should read --an--.

COLUMN 6

Line 42, "geranium" should read --germanium--.

COLUMN 8

Line 1, "geranium" should read --germanium--.

COLUMN 21

Line 12, "a i-layer" should read --an i-layer--.
Line 28, "Example 1-2were" should read --Example 1-2 were--.

COLUMN 22

Line 21, "Example 1-2was" should read --Example 1-2 was--.
Line 36, "com." should read --comp.--.

COLUMN 28

Line 22, "silicon containing" should read --silicon-containing--.

UNITED STATES PATENT AND TRADEMARK OFFICE
CERTIFICATE OF CORRECTION

PATENT NO. : 5,456,762
DATED : October 10, 1995
INVENTOR(S) : TOSHIMITSU KARIYA, ET AL.

It is certified that error appears in the above-identified patent and that said Letters Patent is hereby corrected as shown below:

<u>COLUMN 28</u>

Line 36, "silicon containing" should read
--silicon-containing--.
Line 39, "silicon containing" should read
--silicon-containing--.
Line 41, "photovoltaic" should read --photoelectric conversion--.

<u>COLUMN 30</u>

Line 7, "photoelectric conversion" should read
--photovoltaic--.

Signed and Sealed this

Fifth Day of March, 1996

Attest:

BRUCE LEHMAN

Attesting Officer     Commissioner of Patents and Trademarks